(12) United States Patent
Hung et al.

(10) Patent No.: US 11,756,865 B2
(45) Date of Patent: Sep. 12, 2023

(54) ELECTRONIC DEVICE HAVING SUBSTRATE

(71) Applicant: INDUSTRIAL TECHNOLOGY RESEARCH INSTITUTE, Hsinchu (TW)

(72) Inventors: Sheng-Che Hung, Hsinchu County (TW); Shih-Hsien Wu, Taoyuan (TW); Yu-Wei Huang, Chiayi (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 481 days.

(21) Appl. No.: 17/141,035

(22) Filed: Jan. 4, 2021

(65) Prior Publication Data

US 2021/0257279 A1    Aug. 19, 2021

Related U.S. Application Data

(60) Provisional application No. 62/978,167, filed on Feb. 18, 2020.

(30) Foreign Application Priority Data

Aug. 26, 2020 (TW) ................ 109129162

(51) Int. Cl.
*H01L 23/485* (2006.01)
*H05K 1/11* (2006.01)
*H05K 3/30* (2006.01)
*H05K 3/42* (2006.01)

(52) U.S. Cl.
CPC ............ *H01L 23/485* (2013.01); *H05K 1/114* (2013.01); *H05K 1/115* (2013.01); *H05K 3/303* (2013.01); *H05K 3/421* (2013.01); *H05K 2201/09609* (2013.01)

(58) Field of Classification Search
CPC .............. H01L 23/481; H01L 23/485; H01L 23/49827; H01L 23/49816; H01L 23/49838; H05K 3/421; H05K 3/303
See application file for complete search history.

(56) References Cited

U.S. PATENT DOCUMENTS

| | | |
|---|---|---|
| 10,388,631 B1 | 8/2019 | England |
| 10,446,520 B2 | 10/2019 | Jeng et al. |
| 10,840,227 B2 | 11/2020 | Huang et al. |
| 2014/0000950 A1 | 1/2014 | Hsu et al. |

(Continued)

FOREIGN PATENT DOCUMENTS

| | | |
|---|---|---|
| CN | 103517583 A | 1/2014 |
| CN | 110571322 A | 12/2019 |

(Continued)

OTHER PUBLICATIONS

TW Office Action in Application No. 109129162 dated Oct. 14, 2021.

*Primary Examiner* — Jaehwan Oh
(74) *Attorney, Agent, or Firm* — Maschoff Brennan

(57) ABSTRACT

An electronic device having a substrate includes a substrate and at least one outer layer. The substrate has a plurality of first vias. The outer layer has a plurality of second vias. The outer layer is disposed on a side of the substrate. The first vias have a larger distribution density or quantity than the second vias so that a portion of the first vias are electrically connected to the second vias, and a portion of the first vias are electrically floating.

24 Claims, 10 Drawing Sheets

(56) References Cited

U.S. PATENT DOCUMENTS

2018/0374789 A1 12/2018 Chang et al.
2019/0312067 A1 10/2019 Garner et al.
2019/0378963 A1 12/2019 Liu et al.

FOREIGN PATENT DOCUMENTS

| TW | 201906510 A | 2/2019 |
| TW | 201917855 A | 5/2019 |
| TW | 201923987 A | 6/2019 |
| TW | I677271 B | 11/2019 |

ELECTRONIC DEVICE HAVING SUBSTRATE

CROSS-REFERENCE TO RELATED APPLICATIONS

This non-provisional application claims priority under 35 U.S.C. § 119(a) on provisional patent application No(s). U.S. 62/978,167 filed in U.S.A. on Feb. 18, 2020 and on patent application No(s). 109129162 filed in R.O.C. Taiwan on Aug. 26, 2020, the entire contents of which are hereby incorporated by reference.

TECHNICAL FIELD

The disclosure relates to an electronic device, relates to an electronic device having a substrate including an array of vias.

BACKGROUND

Conventionally, an external electrical component is mounted on a substrate having vias, and the external electrical component can be operated by giving the vias a predetermined potential. The quantity and arrangement of the vias on the substrate were determined by considering the configuration of the external electrical component.

That is, the arrangement of vias on the typical substrate has to be customized for the external electrical component. Therefore, it requires to spend extra time and cost on developing and manufacturing substrates with various arrangements of vias customized for different configurations of external electrical components.

SUMMARY

One embodiment of the disclosure provides an electronic device including a substrate and at least one outer layer. The substrate has a plurality of first vias. The at least one outer layer has a plurality of second vias. The at least one outer layer is disposed on a side of the substrate. The plurality of first vias has a larger distribution density or quantity than the plurality of second vias so that a part of the first vias are electrically connected to the plurality of second vias, and another part of the first vias are electrically floating.

The above description about the content of the disclosure and the following description about the embodiments are used to demonstrate and explain the spirit and principle of the disclosure and provide a further explanation of the scope of claims of the disclosure.

BRIEF DESCRIPTION OF THE DRAWINGS

The disclosure will become better understood from the detailed description given hereinbelow and the accompanying drawings which are given by way of illustration only and thus are not intending to limit the disclosure and wherein.

DETAILED DESCRIPTION

Figure 1:
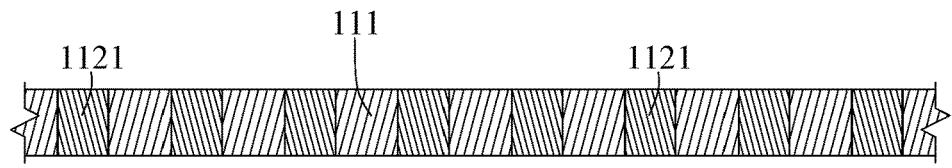
FIG. 1 illustrates a partial schematic cross-sectional view of a substrate according to one embodiment of the disclosure.

Features and advantages of embodiments of the disclosure are described in the following detailed description, it allows the person skilled in the art to understand the technical contents of the embodiments of the disclosure and implement them, and the person skilled in the art can easily comprehend the purposes of the advantages of the disclosure. The following embodiments are further illustrating the perspective of the disclosure, but not intending to limit the disclosure.

The drawings may not be drawn to actual size or scale, some exaggerations may be necessary in order to emphasize basic structural relationships, while some are simplified for clarity of understanding, and the disclosure is not limited thereto. It is allowed to have various adjustments under the spirit of the disclosure. In addition, the spatially relative terms, such as "up", "top", "above", "down", "low", "left", "right", "front", "rear", and "back" and the like, may be used herein for ease of description to describe the relationship of one element or feature to another element(s) of feature(s) as illustrated in the drawings. It will be understood that the spatially relative terms are intended to encompass orientations of the element or feature but not intended to limit the disclosure.

Please refer to FIG. 1, FIG. 2, FIG. 3, and FIG. 4, there are shown schematic views of a substrate according to one embodiment of the disclosure. The disclosure provides an electronic device having a substrate that includes an array of vias that makes the substrate available for most types of external electrical components.

Figure 2:
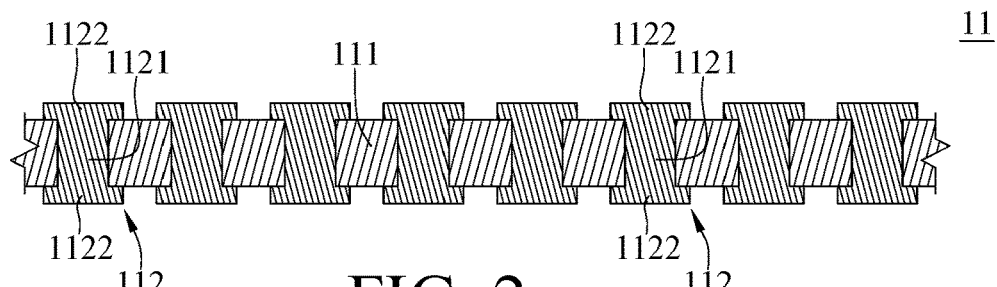
FIG. 2 illustrates a schematic cross-sectional view of the substrate according to the embodiment of the disclosure.
Figure 3:
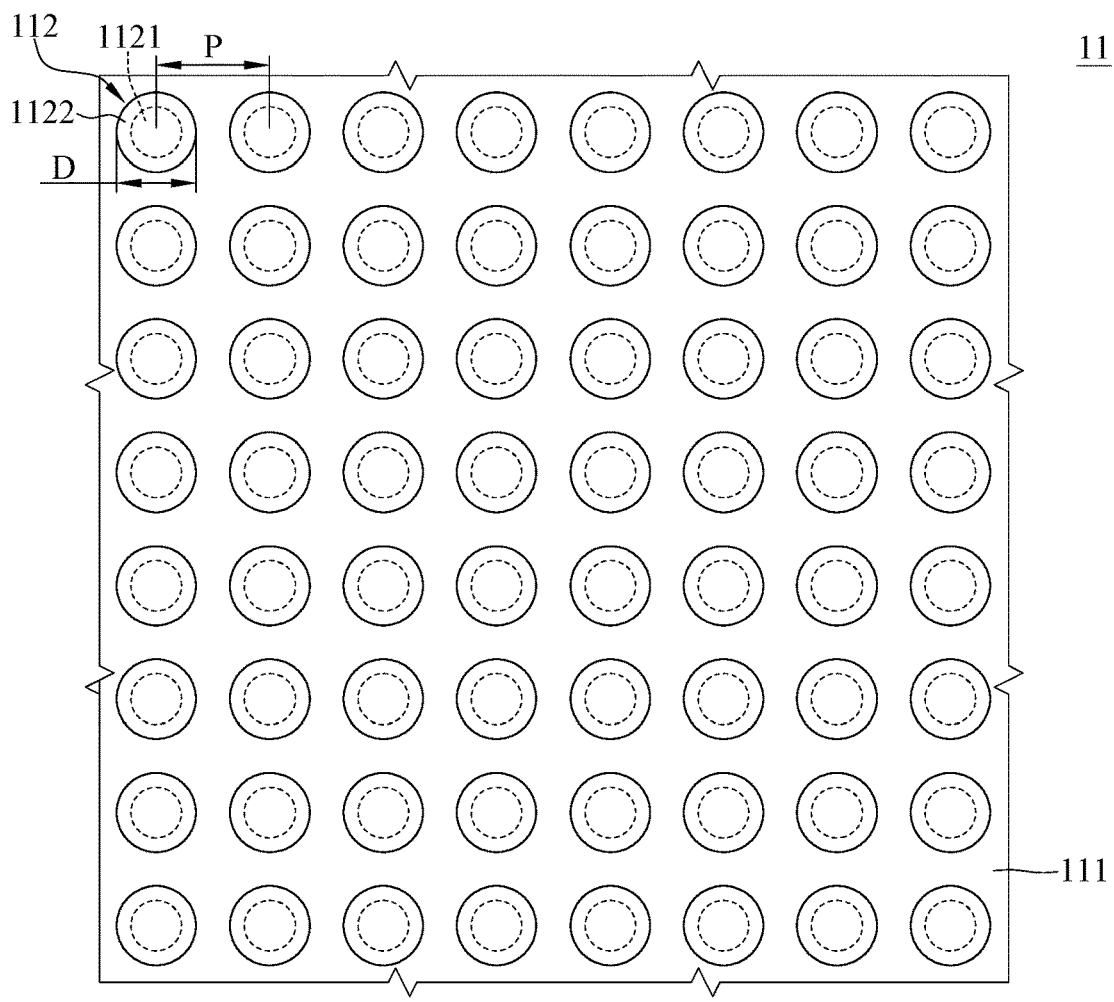
FIG. 3 illustrates a schematic top view of the substrate in FIG. 2.
Figure 4:
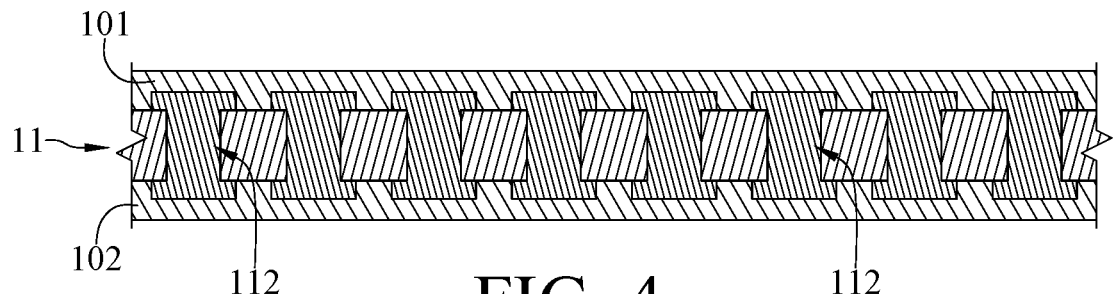
FIG. 4 illustrates a schematic cross-sectional view of the substrate and protecting layers according to one embodiment of the disclosure.

FIG. 1 illustrates a partial schematic cross-sectional view of the substrate according to the embodiment of the disclosure. FIG. 2 illustrates a schematic cross-sectional view of the substrate according to the embodiment of the disclosure. FIG. 3 illustrates a schematic top view of the substrate in FIG. 2. FIG. 4 illustrates a schematic cross-sectional view of the substrate and protecting layers according to the embodiment of the disclosure.

As shown in FIG. 1, in this embodiment, there is a plurality of conductive elements 1121 that is disposed through a core layer 111 of the substrate 11. The conductive elements 1121 are spaced apart from one another.

As shown in FIG. 2 and FIG. 3, in this embodiment, there is a plurality of conductive pads 1122 that is disposed on an upper surface and a lower surface of the core layer 111. The conductive pads 1122 are arranged on upper ends and lower ends of the conductive elements 1121 so as to be electrically connected to the conductive elements 1121. Specifically, one conductive element 1121 and two conductive pads 1122 electrically connected to the upper end and the lower end thereof together form a first via 112. Thus, there is a plurality of first vias 112 on the substrate 11. Each of the first vias 112 is solid. The core layer 111 and the first vias 112 thereon together form the substrate 11. The core layer 111 is made of a material selected from a group consisting of a semiconductor material (e.g., silicon, gallium, germanium, and gallium nitride) and a non-conductive material (e.g., epoxy resin).

As shown in FIG. 3, the first vias 112 are arranged in an array. In this embodiment, the conductive pad 1122 has the maximum outer diameter D of the first via 112. In one embodiment, the outer diameter D of the conductive pad 1122 ranges from 5 μm to 100 μm. In addition, in FIG. 3, P refers to the center distance between two centers of the first vias 112 adjacent to each other. And the smallest center distance P among the first vias 112 is in micrometer scale.

Note that, in the disclosure, the first via 112 is not restricted to include one conductive element 1121 and two conductive pads 1122. In other embodiments, the first vias may omit the conductive pads or have one conductive pad.

As shown in FIG. 4, in this embodiment, a protecting layer 101 and a protecting layer 102 are arranged on an upper surface and a lower surface of the substrate 11, respectively. The protecting layer 101 and the protecting layer 102 can protect the substrate 11 from ambient substances so as to prevent it from oxidizing.

Various exemplary implementations of the substrate 11 and the advantages to be derived therefrom will be described hereinafter.

Figure 5:
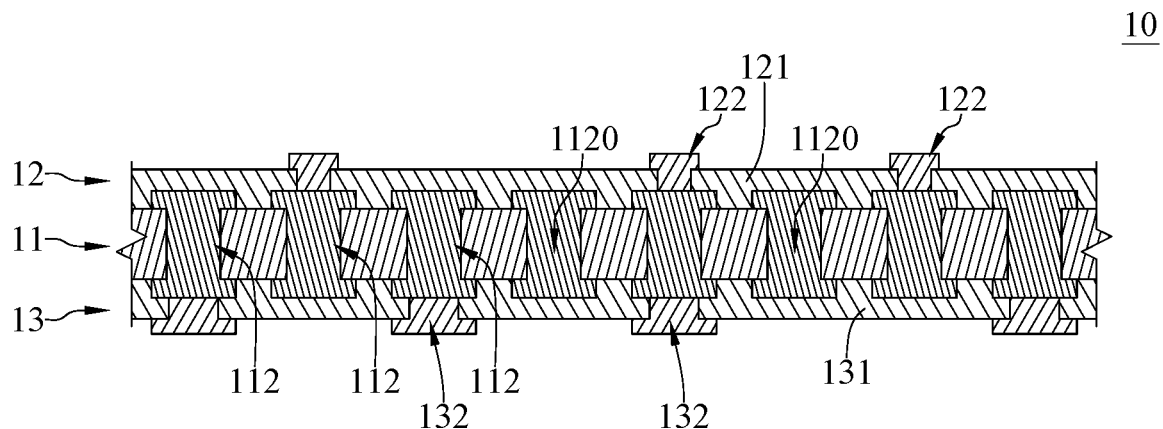
FIG. 5 illustrates a schematic cross-sectional view of an electronic device having the substrate according to one embodiment of the disclosure.

Please refer to FIG. 5, there is illustrated a schematic cross-sectional view of an electronic device having the substrate according to one embodiment of the disclosure.

As shown in FIG. 5, in this embodiment, an electronic device 10 employs the substrate 11 in FIG. 2. In FIG. 5, the substrate 11 is covered by an outer layer 12 and an outer layer 13, where a plurality of second vias 122 and a plurality of second vias 132 are provided in the outer layer 12 and the outer layer 13, and at least one or some of the first vias 112 that is not electrically connected to the second vias 122 and 132 will be numbered as '1120'; that is, in FIG. 5, some of the first vias are numbered as '112' and the rest is numbered as '1120'. The detail descriptions are given below.

In this embodiment, an insulating layer 121 is disposed on the upper surface of the substrate 11, and the second vias 122 is disposed through the insulating layer 121. Each of the second vias 122 is electrically connected to different one of the first vias 112, that is, the second vias 122 are respectively electrically connected to the different first vias 112. In other words, the second vias 122 are electrically connected to some of the first vias 112 in a one-to-one manner. The insulating layer 121 and the second vias 122 together form the outer layer 12. As shown, in the range of the substrate 11, the distribution density of the first vias 112 and 1120 have a larger distribution density or quantity than the second vias 122. Thus, the first vias 1120 and some of the first vias 112 are not electrically connected to the second vias 122.

Further, an insulating layer 131 is disposed on the lower surface of the substrate 11, and the second vias 132 is disposed through the insulating layer 131. Each of the second vias 132 is electrically connected to different one of the first vias 112, that is, the second vias 132 are respectively electrically connected to the different first vias 112. In other words, the second vias 132 are electrically connected to some of the first vias 112 in a one-to-one manner. The insulating layer 131 and the second vias 132 together form the outer layer 13. As shown, in the range of the substrate 11, the first vias 112 and 1120 have a larger distribution density and quantity than the second vias 132. Thus, the first vias 1120 and some of the first vias 112 are not electrically connected to the second vias 132.

As shown, the outer layer 12 and the outer layer 13 are disposed on the upper and lower surface of the substrate 11, respectively. The second vias 122 are electrically connected to some of the first vias 112 in a one-to-one manner, and the second vias 132 are electrically connected to some of the first vias 112 in a one-to-one manner. Due to the difference in the quantity and the distribution density, some of the first vias 112 are electrically connected to the second vias 122 but not electrically connected to the second vias 132, some of the first vias 112 are electrically connected to the second vias 132 but not electrically connected to the second vias 122, some of the first vias 112 are electrically connected to the second vias 122 and the second vias 132, and the first vias 1120 are electrically floating and neither electrically connected to the second vias 122 and 132 nor any potential.

During operation, a predetermined potential, such as ground or electrical signal, can be applied to some of the first vias 112 by applying it to the second vias 122 and 132. Around the first vias 112 that are served as input for electrical signal, the more of the first vias 1120 being electrically floating around the first vias 112 that received electrical signal, the larger the equivalent impedance exists in these first vias 112. To reduce the equivalent impedance in these first vias 112, the first vias 112 therearound are grounded.

Note that the protecting layer 101 and the protecting layer 102 in FIG. 4 may not be dispensable. In one embodiment, the protecting layer 101 and the protecting layer 102 can be removed and respectively replaced by the outer layer 12 and the outer layer 13 to make the whole fit the external electrical component. In other embodiments, the protecting layer 101 and the protecting layer 102 may be served as the insulating layer 121 of the outer layer 12 and the insulating layer 131 of the outer layer 13, respectively.

Figure 6:
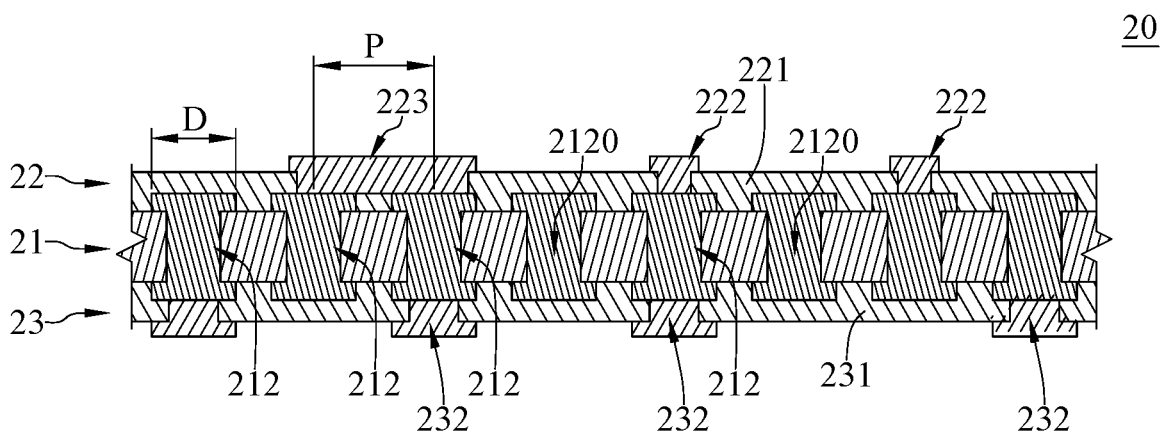
FIG. 6 illustrates a schematic cross-sectional view of an electronic device having the substrate according to another embodiment of the disclosure.

Please refer to FIG. 6, there is illustrated a schematic cross-sectional view of an electronic device having the substrate according to another embodiment of the disclosure.

As shown in FIG. 6, the electronic device 20 includes a substrate 21, an outer layer 22, and an outer layer 23. In this embodiment, the electronic device 20 employs the substrate 21 substantially the same as the substrate 11 in FIG. 2. In FIG. 6, the substrate 21 is covered by an outer layer 22 and an outer layer 23, where a plurality of second vias 222 and 223 and a plurality of second vias 232 are provided in the outer layer 22 and the outer layer 13, and at least one or some of the first vias 212 that is not electrically connected to the second vias 222, 223, and 232 will be numbered as '2120'; that is, in FIG. 6, some of the first vias are numbered as '212' and the rest is numbered as '2120'. The detail descriptions are given below.

The substrate 21 includes a plurality of first vias 212 and 2120. Each of the first vias 212 and 2120 is solid. The maximum outer diameter D of each of the first vias 212 and 2120 ranges from 5 µm to 100 µm. The first vias 212 and 2120 are arranged in an array. In addition, in FIG. 6, P refers to the center distance between two centers of the first vias 212 and 2120 adjacent to each other. And the smallest center distance P among the first vias 212 and 2120 is in micrometer scale.

In this embodiment, an insulating layer 221 is disposed on the upper surface of the substrate 21, and a plurality of second vias 222 and 223 is disposed through the insulating layer 221. Each of the second vias 222 is electrically connected to different one of the first vias 212, that is, the second vias 222 are respectively electrically connected to the different first vias 212. In other words, the second vias 222 are electrically connected to some of the first vias 212 in a one-to-one manner. In addition, each of the second vias 223 is electrically connected to different some of the first vias 212. In other words, the second vias 223 are electrically connected to the first via 212 in a one-to-plurality manner. The insulating layer 221 and the second vias 222 and 223 together form the outer layer 22. As shown, in the range of the substrate 21, the first vias 212 and 2120 have a larger distribution density and quantity than the second vias 222 and 223. Thus, the first vias 2120 and some of the first vias 212 are not electrically connected to the second vias 222 and 223.

Further, an insulating layer 231 is disposed on the lower surface of the substrate 21, and the second vias 232 is disposed through the insulating layer 231. Each of the second vias 232 is electrically connected to different one of the first vias 212, that is, the second via 232 are respectively electrically connected to the different first vias 212. In other words, the second vias 232 are electrically connected to some of the first vias 212 in a one-to-one manner. The insulating layer 231 and the second vias 232 together form the outer layer 23. As shown, in the range of the substrate 21, the first vias 212 and 2120 have a larger quantity and distribution density than the second vias 232. Thus, the first vias 2120 and some of the first vias 212 are not electrically connected to the second vias 232.

As shown, the outer layer 22 and the outer layer 23 are disposed on the upper and lower surface of the substrate 21, respectively. The second vias 222 are electrically connected to some of the first vias 212 in a one-to-one manner, the second vias 223 are electrically connected to some of the first vias 212 in a one-to-plurality manner, and the second vias 232 are electrically connected to some of the first vias 212 in a one-to-one manner.

Due to the difference in the quantity and the distribution density, some of the first vias 212 are electrically connected to the second vias 222 but not electrically connected to the second vias 232, some of the first vias 212 are electrically connected to the second vias 223 but not electrically connected to the second vias 232, some of the first vias 212 are electrically connected to the second vias 232 but not electrically connected to the second vias 222 and 223, some of the first vias 212 are electrically connected to the second vias 222 and the second vias 232, and some of the first vias 212 are electrically connected to the second vias 223 and the second vias 232. Some of the first vias 212 may be at the same potential through one of the second vias 223. Comparing with the second vias 222, each of the second vias 223 may allow a larger current to flow therethrough because it is electrically connected to the first vias 212 in a one-to-plurality manner. The first vias 2120 are electrically floating and neither electrically connected to the second vias 222, 223, and 232 nor any potential.

During operation, a predetermined potential, such as ground or electrical signal, can be applied to some of the first vias 212 by applying it to the second vias 222, 223, and 232. Around the first vias 212 that are served as an input for electrical signal, the more of the first vias 2120 being electrically floating around the first vias 212 that received electrical signal, the larger the equivalent impedance exists in these first vias 212. To reduce the equivalent impedance in these first vias 212, the first vias 212 therearound are grounded.

Figure 7:
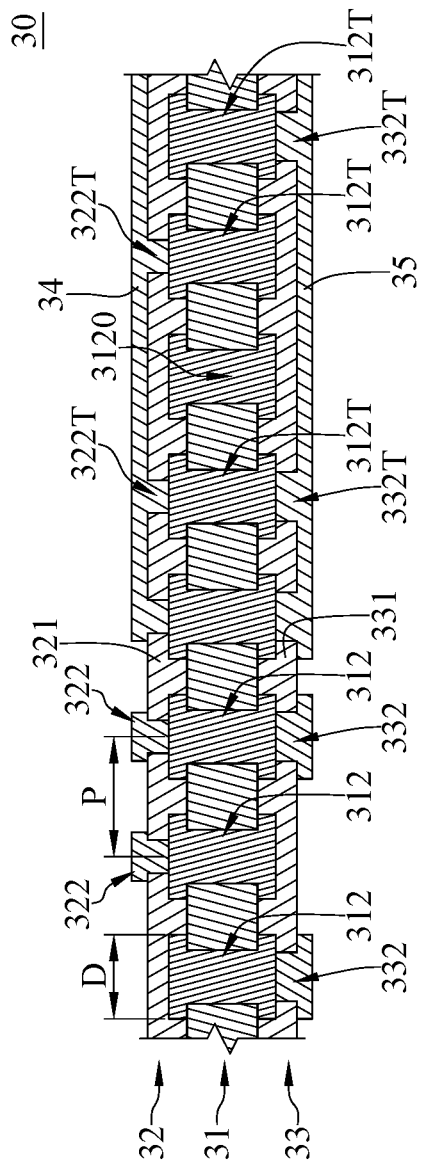
FIG. 7 illustrates a schematic cross-sectional view of an electronic device having the substrate according to another embodiment of the disclosure.

Please refer to FIG. 7, there is illustrated a schematic cross-sectional view of an electronic device having the substrate according to another embodiment of the disclosure.

As shown in FIG. 7, the electronic device 30 includes a substrate 31, an outer layer 32, an outer layer 33, a conductive trace 34, and a conductive trace 35. In this embodiment, the electronic device 30 employs the substrate 31 substantially the same as the substrate 11 shown in FIG. 2. In FIG. 7, the substrate 31 is covered by an outer layer 32 and an outer layer 33, where a plurality of second vias 322 and 322T and a plurality of second vias 332 and 332T are provided in the outer layer 32 and the outer layer 33, and at least one or some of the first vias 312 and 312T that is not electrically connected to the second vias 322, 322T, 332, and 332T will be numbered as '3120'; that is, in FIG. 7, some of the first vias are numbered as '312' and '312T' and the rest is numbered as '3120'. The detail descriptions are given below.

The substrate 31 includes a plurality of first vias 312, 3120, and 312T. Each of the first vias 312, 3120, and 312T is solid. The maximum outer diameter D of each of the first vias 312, 3120, and 312T ranges from 5 µm to 100 µm. The first vias 312, 3120, and 312T are arranged in an array. In addition, in FIG. 7, P refers to the center distance between two centers of the first vias 312, 3120, and 312T adjacent to each other. And the smallest center distance P among the first vias 312, 3120, and 312T is in micrometer scale.

In this embodiment, an insulating layer 321 is disposed on the upper surface of the substrate 31, and the second vias 322 and 322T are disposed through the insulating layer 321. Each of the second vias 322 is electrically connected to different one of the first vias 312, that is, the second vias 322 are respectively electrically connected to the different first vias 312. In other words, the second vias 322 are electrically connected to some of the first vias 312 in a one-to-one manner. In addition, each of the second vias 322T is electrically connected to different one of the first vias 312T, that is, the second vias 322T are respectively electrically connected to the different first vias 312T. In other words, the second vias 322T are electrically connected to some of the first vias 312T in a one-to-one manner. The insulating layer 321 and the second vias 322 and 322T together form the outer layer 32. The conductive trace 34 is disposed on the outer layer 32 and electrically connected to some of the second vias 322T. As shown, in the range of the substrate 31, the first vias 312, 3120, and 312T have a larger distribution density and quantity than the second vias 322 and 322T. Thus, the first vias 3120, some of the first vias 312, and some of the first vias 312T are not electrically connected to the second vias 322 and 322T.

Further, an insulating layer 331 is disposed on the lower surface of the substrate 31, and the second vias 332 and 332T are disposed through the insulating layer 331. Each of the second vias 332 is electrically connected to different one of the first vias 312, that is, the second vias 332 are respectively electrically connected to the different first vias 312. In other words, the second vias 332 are electrically connected to some of the first vias 312 in a one-to-one manner. In addition, each of the second vias 332T is electrically connected to different one of the first vias 312T, that is, the second vias 332T are respectively electrically connected to the different first vias 312T. In other words, the second vias 332T are electrically connected to some of the first vias 312T in a one-to-one manner. The insulating layer 331 and the second vias 332 and 332T together form the outer layer 33. The conductive trace 35 is disposed on the outer layer 33 and electrically connected to some of the second vias 332T. As shown, in the range of the substrate 31, the first vias 312, 3120, and 312T have a larger distribution density and quantity than the second vias 332 and 332T. Thus, the first vias 3120, some of the first vias 312, and some of the first vias 312T are not electrically connected to the second vias 332 and 332T.

As shown, the outer layer 32 and the outer layer 33 are disposed on the upper and lower surface of the substrate 31, respectively. The second vias 322 and 322T are electrically connected to some of the first vias 312 and 312T in a one-to-one manner, and the second vias 332 and 332T are electrically connected to some of the first vias 312 and 312T in a one-to-one manner.

Due to the difference in the quantity and the distribution density, some of the first vias 312 are electrically connected to the second vias 322 but not electrically connected to the second vias 332 and 332T, some of the first vias 312 are electrically connected to the second vias 332 but not electrically connected to the second vias 322 and 322T, and some of the first vias 312 are electrically connected to the second vias 322 and the second vias 332. Further, some of the first vias 312T are electrically connected to the second vias 322T but not electrically connected to the second vias 332 and 332T, some of the first vias 312T are electrically connected to the second vias 332T but not electrically connected to the second vias 322 and 322T, and some of the first vias 312T are electrically connected to the second vias 322T and the second vias 332T.

The second vias 322T may be at the same potential through the conductive trace 34. The second vias 332T may be at the same potential through the conductive trace 35. The conductive trace 34 and the conductive trace 35 may be electrically connected to each other and at the same potential through the second vias 322T, the first vias 312T, and the second vias 332T which are electrically connected to each other. When a predetermined potential is applied to the conductive trace 34 or the conductive trace 35, the predetermined potential is applied to the second vias 322T, the first vias 312T, and the second vias 332T. The first vias 3120 are electrically floating and neither electrically connected to the second vias 322, 322T, 332, and 332T nor any potential.

During operation, a predetermined potential, such as ground or electrical signal, can be applied to the first vias 312 and 312T by applying it to some of the first vias 322, 322T, 332, and 332T. Around the first vias 312 and 312T that are served as input for electrical signal, the more of the first vias 3120 being electrically floating around the first vias 312 and 312T that received electrical signal, the larger the equivalent impedance exists in these first vias 312 and 312T. To reduce the equivalent impedance in these first vias 312 and 312T, the first vias 312 and 312T therearound are grounded.

Figure 8:
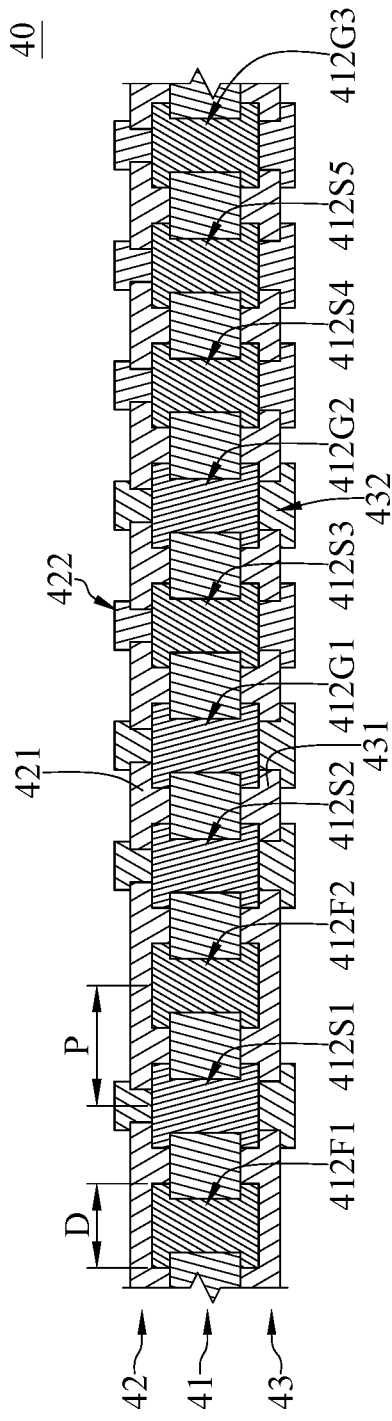
FIG. 8 illustrates a schematic cross-sectional view of an electronic device having the substrate according to another embodiment of the disclosure.

Please refer to FIG. 8, there is illustrated a schematic cross-sectional view of an electronic device having the substrate according to another embodiment of the disclosure.

As shown in FIG. 8, the electronic device 40 includes a substrate 41, an outer layer 42, and an outer layer 43. In this embodiment, the electronic device 40 employs the substrate 41 substantially the same as the substrate 11 shown in FIG. 2. The detail descriptions are given below.

The substrate 41 includes a plurality of first vias 412F1, 412F2, 412G1, 412G2, 412G3, 412S1, 412S2, 412S3, 412S4, and 412S5. Each of the first vias 412F1, 412F2, 412G1, 412G2, 412G3, 412S1, 412S2, 412S3, 412S4, and 412S5 is solid. The maximum outer diameter D of each of the first vias 412F1, 412F2, 412G1, 412G2, 412G3, 412S1, 412S2, 412S3, 412S4, and 412S5 ranges from 5 μm to 100 μm. The first vias 412F1, 412F2, 412G1, 412G2, 412G3, 412S1, 412S2, 412S3, 412S4, and 412S5 are arranged in an array. In addition, in FIG. 8, P refers to the center distance between two centers of the first vias 412F1, 412F2, 412G1, 412G2, 412G3, 412S1, 412S2, 412S3, 412S4, and 412S5 adjacent to each other. And the smallest center distance P among the first vias 412F1, 412F2, 412G1, 412G2, 412G3, 412S1, 412S2, 412S3, 412S4, and 412S5 is in micrometer scale.

In this embodiment, an insulating layer 421 is disposed on the upper surface of the substrate 41, and a plurality of second vias 422 is disposed through the insulating layer 421. Each of the second vias 422 is electrically connected to different one of the first vias 412G1, 412G2, 412G3, 412S1, 412S2, 412S3, 412S4, and 412S5, that is, the second vias 422 are respectively electrically connected to the different first vias 412G1, 412G2, 412G3, 412S1, 412S2, 412S3, 412S4, and 412S5. In other words, the second vias 422 are electrically connected to the first vias 412G1, 412G2, 412G3, 412S1, 412S2, 412S3, 412S4, and 412S5 in a one-to-one manner. The insulating layer 421 and the second vias 422 together form the outer layer 42. As shown, in the range of the substrate 41, the first vias 412F1, 412F2, 412G1, 412G2, 412G3, 412S1, 412S2, 412S3, 412S4, and 412S5 have a larger distribution density and quantity than the second vias 422. Thus, the first vias 412F1 and 412F2 are not electrically connected to the second vias 422.

Further, an insulating layer 431 is disposed on the lower surface of the substrate 41, and a plurality of second vias 432 is disposed through the insulating layer 431. Each of the second vias 432 is electrically connected to different one of the first vias 412G1, 412G2, 412G3, 412S1, 412S2, 412S3, 412S4, and 412S5, that is, the second vias 432 are respectively electrically connected to the different first vias 412G1, 412G2, 412G3, 412S1, 412S2, 412S3, 412S4, and 412S5. In other words, the second vias 432 are electrically connected to the first vias 412G1, 412G2, 412G3, 412S1, 412S2, 412S3, 412S4, and 412S5 in a one-to-one manner. The insulating layer 431 and the second vias 432 together form the outer layer 43. As shown, in the range of the substrate 41, the first vias 412F1, 412F2, 412G1, 412G2, 412G3, 412S1, 412S2, 412S3, 412S4, and 412S5 have a larger distribution density and quantity than the second vias 432. Thus, the first vias 412F1 and 412F2 are not electrically connected to the second vias 432.

As shown, the outer layer 42 and the outer layer 43 are disposed on the upper and lower surface of the substrate 41, respectively. The second vias 422 are electrically connected to the first vias 412G1, 412G2, 412G3, 412S1, 412S2, 412S3, 412S4, and 412S5 in a one-to-one manner, and the second vias 432 are electrically connected to the first vias 412G1, 412G2, 412G3, 412S1, 412S2, 412S3, 412S4, and 412S5 in a one-to-one manner.

Due to the difference in the quantity and the distribution density, the first vias 412G1, 412G2, 412G3, 412S1, 412S2, 412S3, 412S4, and 412S5 are electrically connected to the second vias 422 and the second vias 432. The first vias 412F1 and 412F2 are electrically floating and neither electrically connected to the second vias 422 and 432 nor any potential.

The first vias 412F1, 412F2, 412G1, 412G2, 412G3, 412S1, 412S2, 412S3, 412S4, and 412S5 include the first vias 412G1, 412G2, and 412G3 that can be used as ground vias and the first vias 412S1, 412S2, 412S3, 412S4, and 412S5 that can be used as signal vias.

In addition, the first via 412F1 being electrically floating is arranged adjacent to the first via 412S1 being used as a signal via. The first vias 412F1 and 412F2 being electrically floating are arranged around the first via 412S1 being used as a signal via. The first vias 412F1 and 412F2 being electrically floating and the first vias 412S1 and 412S2 being used as signal vias are arranged in an alternate manner. The first via 412F2 being electrically floating and the first via 412G1 being used as a ground via are arranged adjacent to the first via 412S2 being used as a signal via.

Further, the first via 412G1 being used as a ground via is arranged adjacent to the first via 412S3 being used as signal vias. The first vias 412G1 and 412G2 being used as ground vias are arranged around the first via 412S3 being used as a signal via. The first vias 412G1 and 412G2 being used as the ground vias and the first vias 412S3 and 412S4 being used as signal vias are arranged in an alternate manner. The first vias 412G2 and 412G3 being used as ground vias are arranged around the first vias 412S4 and 412S5 being arranged adjacent to each other and being used as signal vias.

During operation, a predetermined potential can be applied to the first vias 412G1, 412G2, 412G3, 412S1, 412S2, 412S3, 412S4, and 412S5 by applying it to some of the first vias 422 and 432, such as grounding the first vias 412G1, 412G2, and 412G3 and inputting electrical signal to the first vias 412S1, 412S2, 412S3, 412S4, and 412S. Differential signals may be input to the first vias 412S4 and 412S5 being arranged adjacent to each other and being used as signal vias.

In this embodiment, the first vias 412F1 and 412F2 being electrically floating are arranged around the first via 412S1. The first via 412F2 being electrically floating and the first via 412G1 being used as a ground via are arranged around the first via 412S2. The first vias 412G1 and 412G2 being used as ground vias are arranged around the first via 412S3. Comparing among the equivalent impedances existing in the first vias 412S1, 412S2, and 412S3, the equivalent impedance existing in the first via 412S1 is larger than that existing in the first via 412S2, and the equivalent impedance existing in the first via 412S2 is larger than that existing in the first via 412S3. To reduce the equivalent impedance existing in the first vias 412S4 and 412S5 that are used as an input for differential signal, the first vias 412G1 and 412G2 therearound are grounded.

Figure 9:
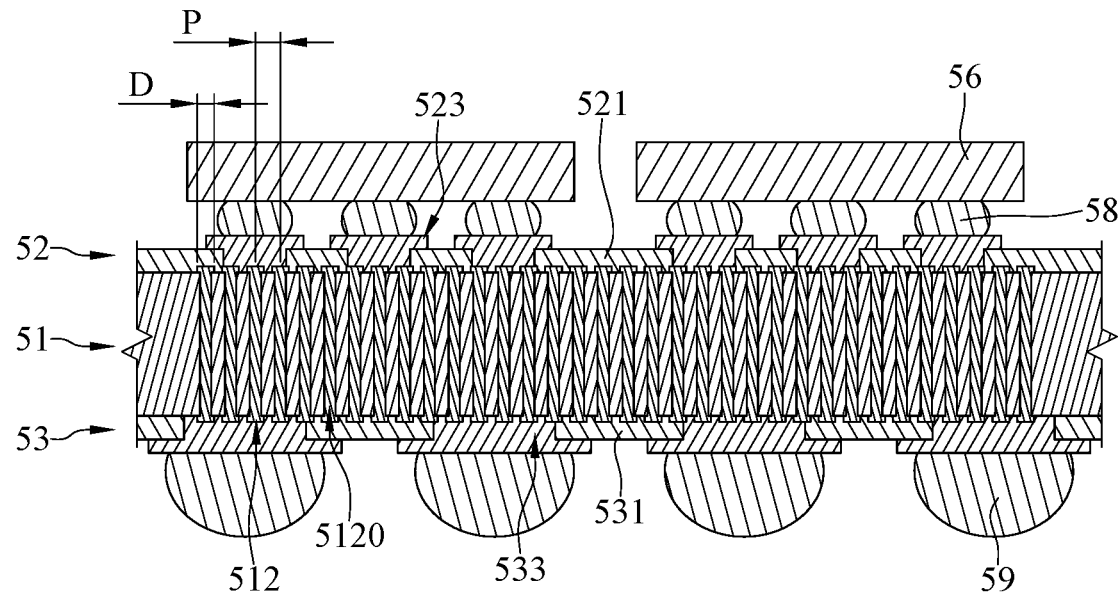
FIG. 9 illustrates a schematic cross-sectional view of an electronic device having the substrate according to another embodiment of the disclosure.

Please refer to FIG. 9, there is illustrated a schematic cross-sectional view of an electronic device having the substrate according to another embodiment of the disclosure.

As shown in FIG. 9, the electronic device 50 includes a substrate 51, an outer layer 52, an outer layer 53, a plurality of electrical components 56, a plurality of conductive materials 58, and a plurality of conductive materials 59. In this embodiment, the electronic device 50 employs the substrate 51 substantially the same as the substrate 11 shown in FIG. 2. In FIG. 9, the substrate 51 is covered by an outer layer 52 and an outer layer 53, where a plurality of second vias 523 and a plurality of second vias 533 are provided in the outer layer 52 and the outer layer 53, and at least one or some of the first vias 512 that is not electrically connected to the second vias 523 and 533 will be numbered as '5120'; that is, in FIG. 9, some of the first vias are numbered as '512' and the rest is numbered as '5120'. The detail descriptions are given below.

The substrate 51 includes a plurality of first vias 512 and 5120. Each of the first vias 512 and 5120 is solid. The maximum outer diameter D of each of the first vias 512 and 5120 ranges from 5 μm to 100 μm. The first vias 512 and 5120 are arranged in an array. In addition, in FIG. 9, P refers to the center distance between two centers of the first vias 512 and 5120 adjacent to each other. And the smallest center distance P among the first vias 512 and 5120 is in micrometer scale.

In this embodiment, an insulating layer 521 is disposed on the upper surface of the substrate 51, and the second vias 523 are disposed through the insulating layer 521. Each of the second vias 523 is electrically connected to different some of the first vias 512. In other words, the second vias 523 are electrically connected to the first via 512 in a one-to-plurality manner. The insulating layer 521 and the second vias 523 together form the outer layer 52. As shown, in the range of the substrate 51, the first vias 512 and 5120 have a larger distribution density and quantity than the second vias 523. Thus, the first vias 5120 and some of the first vias 512 are not electrically connected to the second vias 523.

Further, an insulating layer 531 is disposed on the lower surface of the substrate 51, and the second vias 533 are disposed through the insulating layer 531. Each of the second vias 533 is electrically connected to different some of the first vias 512. In other words, the second vias 533 are electrically connected to the first via 512 in a one-to-plurality manner. The insulating layer 531 and the second vias 533 together form the outer layer 53. As shown, in the range of the substrate 51, the first vias 512 and 5120 have a larger distribution density and quantity than the second vias 533. Thus, the first vias 5120 and some of the first vias 512 are not electrically connected to the second vias 533.

As shown, the outer layer 52 and the outer layer 53 are disposed on the upper and lower surface of the substrate 51, respectively. The second vias 523 are electrically connected to some of the first vias 512 in a one-to-plurality manner, and the second vias 533 are electrically connected to some of the first vias 512 in a one-to-plurality manner.

Due to the difference in the quantity and the distribution density, some of the first vias 512 are electrically connected to the second vias 523 but not electrically connected to the second vias 533, some of the first vias 512 are electrically connected to the second vias 533 but not electrically connected to the second vias 523, and some of the first vias 512 are electrically connected to the second vias 523 and the second vias 533.

Some of the first vias 512 may be at the same potential through one of the second vias 523. Each of the second vias 523 may allow a large current to flow therethrough because it is electrically connected to the first vias 512 in a one-to-plurality manner. Some of the first vias 512 may be at the same potential through one of the second vias 533. Each of the second vias 533 may allow a large current to flow therethrough because it is electrically connected to the first vias 512 in a one-to-plurality manner. The first vias 5120 are electrically floating and neither electrically connected to the second vias 523 and 533 nor any potential.

In this embodiment, the conductive materials 58 are electrically connected to the second vias 523, respectively. Each of the electrical components 56 is disposed on the outer layer 52 and electrically connected to the second vias 523 through the conductive materials 58. The electrical components 56 may be an active component or a passive component such as a resistor, a capacitor, an inductor, and the like. The conductive materials 59 are electrically connected to the second vias 533, respectively. The conductive materials 58 and 59 may be solder balls.

During operation, a predetermined potential, such as ground or electrical signal, can be applied to the conductive materials 58 by applying it to the conductive materials 59, the second vias 533, some of the first vias 512, and the second vias 523. Therefore, the predetermined potential is further applied to the electrical component 56. Around the first vias 512 that are served as input for electrical signal, the more of the first vias 5120 being electrically floating around the first vias 512 that received electrical signal, the larger the equivalent impedance exists in these first vias 512. To reduce the equivalent impedance in these first vias 512, the first vias 512 therearound are grounded.

Figure 10:
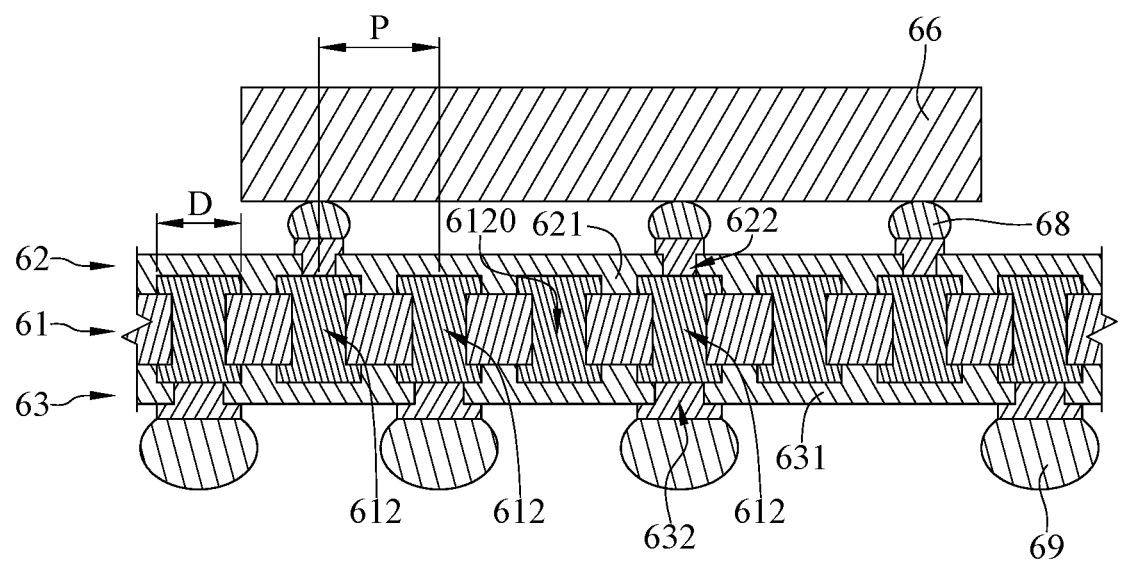
FIG. 10 illustrates a schematic cross-sectional view of an electronic device having the substrate according to another embodiment of the disclosure.

Please refer to FIG. 10, there is illustrated a schematic cross-sectional view of an electronic device having the substrate according to another embodiment of the disclosure.

As shown in FIG. 10, the electronic device 60 includes a substrate 61, an outer layer 62, an outer layer 63, an electrical component 66, a plurality of conductive materials 68, and a plurality of conductive materials 69. In this embodiment, the electronic device 60 employs the substrate 61 substantially the same as the substrate 11 shown in FIG. 2. In FIG. 10, the substrate 61 is covered by an outer layer 62 and an outer layer 63, where a plurality of second vias 622 and a plurality of second vias 632 are provided in the outer layer 62 and the outer layer 63, and at least one or some of the first vias 612 that is not electrically connected to the second vias 622 and 632 will be numbered as '6120'; that is, in FIG. 10, some of the first vias are numbered as '612' and the rest is numbered as '6120'. The detail descriptions are given below.

The substrate 61 includes a plurality of first vias 612 and 6120. Each of the first vias 612 and 6120 is solid. The maximum outer diameter D of each of the first vias 612 and 6120 ranges from 5 μm to 100 μm. The first vias 612 and 6120 are arranged in an array. In addition, in FIG. 10, P refers to the center distance between two centers of the first vias 612 and 6120 adjacent to each other. And the smallest center distance P among the first vias 612 and 6120 is in micrometer scale.

In this embodiment, an insulating layer 621 is disposed on the upper surface of the substrate 61, and the second vias 622 are disposed through the insulating layer 621. Each of the second vias 622 is electrically connected to different one of the first vias 612, that is, the second vias 622 are respectively electrically connected to the different first vias 612. In other words, the second vias 622 are electrically connected to some of the first vias 612 in a one-to-one manner. The insulating layer 621 and the second vias 622 together form the outer layer 62. As shown, in the range of the substrate 61, the first vias 612 and 6120 have a larger distribution density and quantity than the second vias 622. Thus, the first vias 6120 and some of the first vias 612 are not electrically connected to the second vias 622.

Further, an insulating layer 631 is disposed on the lower surface of the substrate 61, and the second vias 632 are disposed through the insulating layer 631. Each of the second vias 632 is electrically connected to different one of the first vias 612, that is, the second vias 632 are respectively electrically connected to the different first vias 612. In other words, the second vias 632 are electrically connected to some of the first vias 612 in a one-to-one manner. The insulating layer 631 and the second vias 632 together form the outer layer 63. As shown, in the range of the substrate 61, the first vias 612 and 6120 have a larger distribution density and quantity than the second vias 632. Thus, the first vias 6120 and some of the first vias 612 are not electrically connected to the second vias 632.

As shown, the outer layer 62 and the outer layer 63 are disposed on the upper and lower surface of the substrate 61, respectively. The second vias 622 are electrically connected to some of the first vias 612 in a one-to-one manner, and the second vias 632 are electrically connected to some of the first vias 612 in a one-to-one manner.

Due to the difference in the quantity and the distribution density, some of the first vias 612 are electrically connected to the second vias 622 but not electrically connected to the second vias 632, some of the first vias 612 are electrically connected to the second vias 632 but not electrically connected to the second vias 622, and some of the first vias 612 are electrically connected to the second vias 622 and the second vias 632. The first vias 6120 are electrically floating and neither electrically connected to the second vias 622 and 632 nor any potential.

In this embodiment, the conductive materials 68 are electrically connected to the second vias 622, respectively. The electrical component 66 is disposed on the outer layer 62 and electrically connected to the second vias 622 through the conductive materials 68. The electrical component 66 may be an active component or a passive component such as a resistor, a capacitor, an inductor, and the like. The conductive materials 69 are electrically connected to the second vias 632, respectively. The conductive materials 68 and 69 may be solder balls.

During operation, a predetermined potential, such as ground or electrical signal, can be applied to the conductive materials 68 by applying it to the conductive materials 69, the second vias 632, some of the first vias 612, and the second vias 622. Therefore, the predetermined potential is further applied to the electrical component 66. Around the first vias 612 that are served as input for electrical signal, the more of the first vias 6120 being electrically floating around the first vias 612 that received electrical signal, the larger the equivalent impedance exists in these first vias 612. To reduce the equivalent impedance in these first vias 612, the first vias 612 therearound are grounded.

Figure 11:
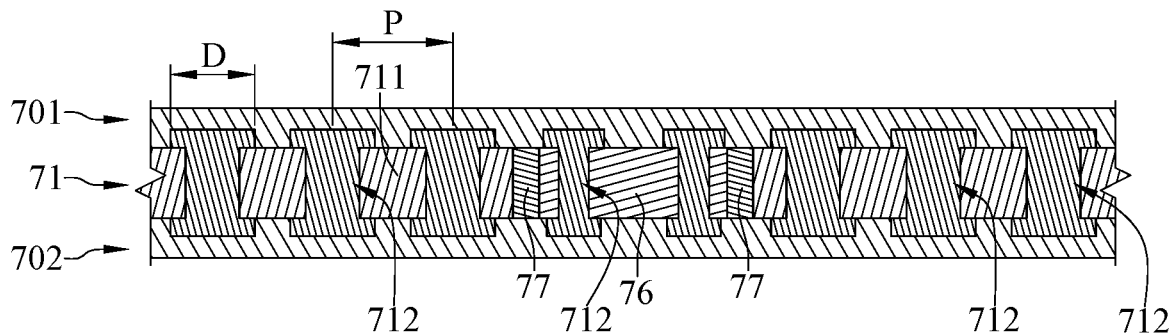
FIG. 11 illustrates a schematic cross-sectional view of a substrate and protecting layers according to another embodiment of the disclosure.

Please refer to FIG. 11, there is illustrated a schematic cross-sectional view of a substrate and protecting layers according to another embodiment of the disclosure.

As shown in FIG. 11, in this embodiment, there is an electrical component 76 embedded or buried in a core layer 711, and the electrical component 76 is fixed in position by a fixing material 77. The electrical component 76 may be an active component or a passive component such as a resistor, a capacitor, an inductor, and the like. There is a plurality of first vias 712 that is disposed through the core layer 711 and the electrical component 76. The first vias 712 are spaced apart from one another.

The core layer 711, the first vias 712, the electrical component 76, and the fixing material 77 together form the substrate 71. That is, the electrical component 76 and the fixing material 77 are embedded or buried in the substrate 71. Each of the first vias 712 is solid. The first vias 712 are arranged in an array. The maximum outer diameter D of each of the first vias 712 ranges from 5 µm to 100 µm. In addition, in FIG. 11, P refers to the center distance between two centers of the first vias 712 adjacent to each other. And the smallest center distance P among the first vias 712 is in micrometer scale. In addition, the core layer 711 is made of a material selected from a group consisting of a semiconductor material (e.g., silicon, gallium, germanium, and gallium nitride) and a non-conductive material (e.g., epoxy resin).

In this embodiment, a protecting layer 701 and a protecting layer 702 are arranged on an upper surface and a lower surface of the substrate 71, respectively. The protecting layer 701 and the protecting layer 702 can protect the substrate 71 from ambient substances so as to prevent it from oxidizing.

Various exemplary implementations of the substrate 71 and the advantages to be derived therefrom will be described hereinafter.

Figure 12:
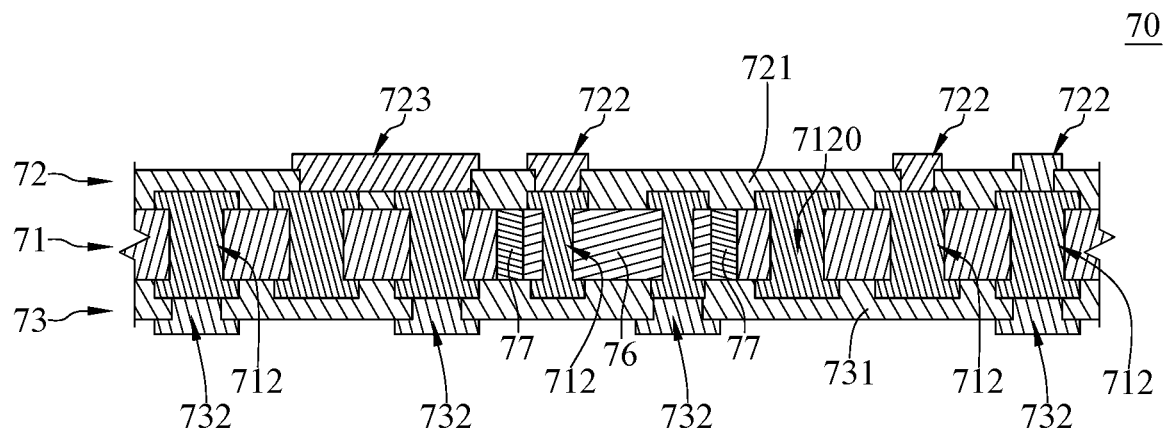
FIG. 12 illustrates a schematic cross-sectional view of an electronic device having the substrate according to another embodiment of the disclosure.

Please refer to FIG. 12, there is illustrated a schematic cross-sectional view of an electronic device having the substrate according to another embodiment of the disclosure.

As shown in FIG. 12, in this embodiment, an electronic device 70 employs the substrate 71 in FIG. 11. In FIG. 12, the substrate 71 is covered by an outer layer 72 and an outer layer 73, where a plurality of second vias 722 and 723 and a plurality of second vias 732 are provided in the outer layer 72 and the outer layer 73, and at least one or some of the first vias 712 that is not electrically connected to the second vias 722, 723 and 732 will be numbered as '7120'; that is, in FIG. 12, some of the first vias are numbered as '712' and the rest is numbered as '7120'. The detail descriptions are given below.

In this embodiment, an insulating layer 721 is disposed on the upper surface of the substrate 71, and the second vias 722 and 723 are disposed through the insulating layer 721. Each of the second vias 722 is electrically connected to different one of the first vias 712, that is, the second vias 722 are respectively electrically connected to the different first vias 712. In other words, the second vias 722 are electrically connected to some of the first vias 712 in a one-to-one manner. In addition, each of the second vias 723 is electrically connected to different some of the first vias 712. In other words, the second vias 723 are electrically connected to the first via 712 in a one-to-plurality manner. The insulating layer 721 and the second vias 722 and 723 together form the outer layer 72. As shown, in the range of the substrate 71, the first vias 712 and 7120 have a larger distribution density and quantity than the second vias 722 and 723. Thus, the first vias 7120 and some of the first vias 712 are not electrically connected to the second vias 722 and 723.

Further, an insulating layer 731 is disposed on the lower surface of the substrate 71, and the second vias 732 are disposed through the insulating layer 731. Each of the second vias 732 is electrically connected to different one of the first vias 712, that is, the second via 732 are respectively electrically connected to the different first vias 712. In other words, the second vias 732 are electrically connected to some of the first vias 712 in a one-to-one manner. The insulating layer 731 and the second vias 732 together form the outer layer 73. As shown, in the range of the substrate 71, the first vias 712 and 7120 have a larger distribution density and quantity than the second vias 732. Thus, the first vias 7120 and some of the first vias 712 are not electrically connected to the second vias 732.

As shown, the outer layer 72 and the outer layer 73 are disposed on the upper and lower surface of the substrate 71, respectively. The second vias 722 are electrically connected to some of the first vias 712 in a one-to-one manner, the second vias 723 are electrically connected to some of the first vias 712 in a one-to-plurality manner, and the second vias 732 are electrically connected to some of the first vias 712 in a one-to-one manner.

Due to the difference in the quantity and the distribution density, some of the first vias 712 are electrically connected to the second vias 722 but not electrically connected to the second vias 732, some of the first vias 712 are electrically connected to the second vias 723 but not electrically connected to the second vias 732, some of the first vias 712 are electrically connected to the second vias 732 but not electrically connected to the second vias 722 and 723, some of the first vias 712 are electrically connected to the second vias 722 and the second vias 732, and some of the first vias 712 are electrically connected to the second vias 723 and the second vias 732. Some of the first vias 712 may be at the same potential through one of the second vias 723. Comparing with the second vias 722, each of the second vias 723 may allow a larger current to flow therethrough because it is electrically connected to the first vias 712 in a one-to-plurality manner. The first vias 7120 are electrically floating and neither electrically connected to the second vias 722, 723, and 732 nor any potential.

During operation, a predetermined potential, such as ground or electrical signal, can be applied to some of the first vias 712 by applying it to the second vias 722, 723, and 732. Around the first vias 712 that are served as input for electrical signal, the more of the first vias 7120 being electrically floating around the first vias 712 that received electrical signal, the larger the equivalent impedance exists in these first vias 712. To reduce the equivalent impedance in these first vias 712, the first vias 712 therearound are grounded.

Note that the protecting layer 701 and the protecting layer 702 in FIG. 11 may not be dispensable. In one embodiment, the protecting layer 701 and the protecting layer 702 can be removed and respectively replaced by the outer layer 72 and the outer layer 73 to make the whole fit the external electrical component. In other embodiments, the protecting layer 701 and the protecting layer 702 may be served as the insulating layer 721 of the outer layer 72 and the insulating layer 731 of the outer layer 73, respectively.

Figure 13:
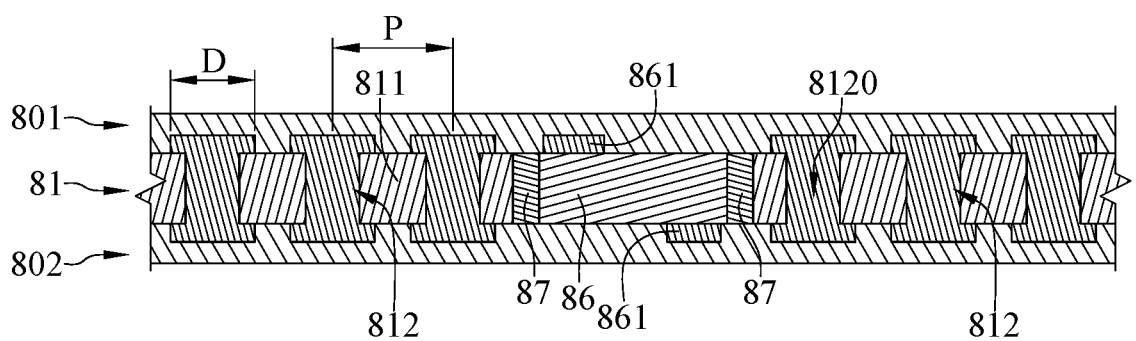
FIG. 13 illustrates a schematic cross-sectional view of a substrate and protecting layers according to another embodiment of the disclosure.

Please refer to FIG. 13, there is illustrated a schematic cross-sectional view of a substrate and protecting layers according to another embodiment of the disclosure.

As shown in FIG. 13, in this embodiment, there is an electrical component 86 embedded or buried in a core layer 811, and the electrical component 86 is fixed in a position by a fixing material 87. The electrical component 86 may be an active component or a passive component such as a resistor, a capacitor, an inductor, and the like. There is a plurality of first vias 812 and 8120 that is disposed through the core layer 811 but not disposed through the electrical component 86. The first vias 812 and 8120 are spaced apart from one another.

The core layer 811, the first vias 812 and 8120, the electrical component 86, and the fixing material 87 together form the substrate 81. That is, the electrical component 86 and the fixing material 87 are embedded or buried in the substrate 81. Each of the first vias 812 and 8120 is solid. The first vias 812 and 8120 are arranged in an array. The maximum outer diameter D of each of the first vias 812 and 8120 ranges from 5 µm to 100 µm. In addition, in FIG. 13, P refers to the center distance between two centers of the first vias 812 and 8120 adjacent to each other. And the smallest center distance P among the first vias 812 and 8120 is in micrometer scale. Further, the electrical component 86 has conductive pads 861 that can be served as inputs of the electrical component 86 for receiving predetermined potential. In addition, the core layer 811 is made of a material selected from a group consisting of a semiconductor material (e.g., silicon, gallium, germanium, and gallium nitride) and a non-conductive material (e.g., epoxy resin).

In this embodiment, a protecting layer 801 and a protecting layer 802 are arranged on an upper surface and a lower surface of the substrate 81, respectively. The protecting layer 801 and the protecting layer 802 can protect the substrate 81 from ambient substances so as to prevent it from oxidizing.

Various exemplary implementations of the substrate 81 and the advantages to be derived therefrom will be described hereinafter.

Figure 14:
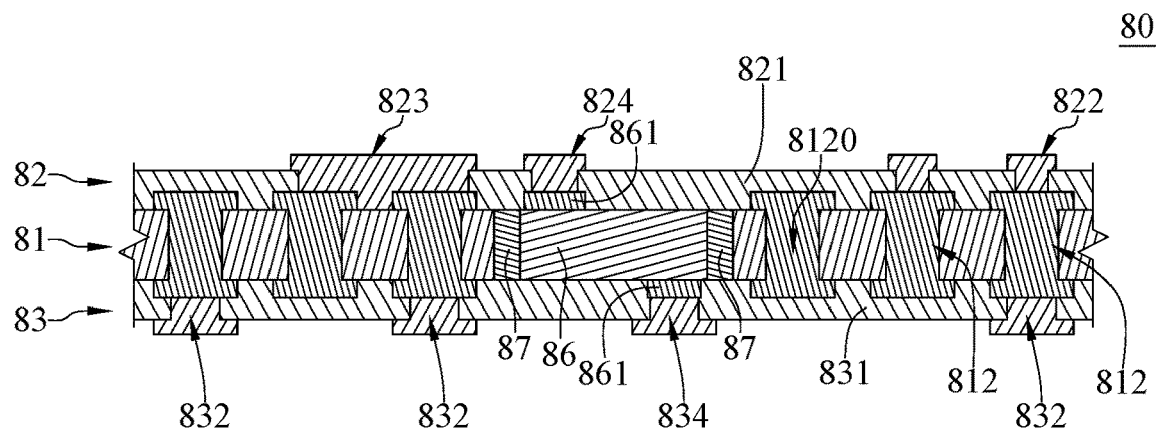
FIG. 14 illustrates a schematic cross-sectional view of an electronic device having the substrate according to another embodiment of the disclosure.

Please refer to FIG. 14, there is illustrated a schematic cross-sectional view of an electronic device having the substrate according to another embodiment of the disclosure.

As shown in FIG. 14, in this embodiment, an electronic device 80 employs the substrate 81 in FIG. 13. In FIG. 14, the substrate 81 is covered by an outer layer 82 and an outer layer 83, where a plurality of second vias 822 and 823 and a plurality of second vias 832 are provided in the outer layer 82 and the outer layer 83, and at least one or some of the first vias 812 that is not electrically connected to the second vias 822, 823, and 832 will be numbered as '8120'; that is, in FIG. 14, some of the first vias are numbered as '812' and the rest is numbered as '8120'. The detail descriptions are given below.

In this embodiment, an insulating layer 821 is disposed on the upper surface of the substrate 81, and the second vias 822 and 823 and a third via 824 are disposed through the insulating layer 821. Each of the second vias 822 is electrically connected to different one of the first vias 812, that is, the second vias 822 are respectively electrically connected to the different first vias 812. In other words, the second vias 822 are electrically connected to some of the first vias 812 in a one-to-one manner. In addition, the third via 824 is electrically connected to one of the conductive pads 861 of the electrical component 86, such that the third via 824 is electrically connected to the electrical component 86. In other words, the third via 824 is electrically connected to one of the conductive pads 861 in a one-to-one manner. Further, each of the second vias 823 is electrically connected to different some of the first vias 812. In other words, the second vias 823 are electrically connected to the first via 812 in a one-to-plurality manner. The insulating layer 821, the second vias 822 and 823, and the third via 824 together form the outer layer 82. As shown, in the range of the substrate 81, first vias 812 and 8120 have a larger distribution density and quantity than the second vias 822 and 823. Thus, the first vias 8120 and some of the first vias 812 are not electrically connected to the second vias 822 and 823.

Further, an insulating layer 831 is disposed on the lower surface of the substrate 81, and the second vias 832 and a third via 834 are disposed through the insulating layer 831. Each of the second vias 832 is electrically connected to different one of the first vias 812, that is, the second vias 832 are respectively electrically connected to the different first vias 812. In other words, the second vias 832 are electrically connected to some of the first vias 812 in a one-to-one manner. In addition, the third via 834 is electrically connected to one of the conductive pads 861 of the electrical component 86, such that the third via 834 is electrically connected to the electrical component 86. In other words, the third via 834 is electrically connected to one of the conductive pads 861 in a one-to-one manner. The insulating layer 831, the second vias 832, and the third via 834 together form the outer layer 83. As shown, in the range of the substrate 81, the first vias 812 and 8120 have a larger distribution density and quantity than the second vias 832. Thus, the first vias 8120 and some of the first vias 812 are not electrically connected to the second vias 832.

As shown, the outer layer 82 and the outer layer 83 are disposed on the upper and lower surface of the substrate 81, respectively. The second vias 822 are electrically connected to some of the first vias 812 in a one-to-one manner, the third via 824 is electrically connected to one of the conductive pads 861 in a one-to-one manner so as to apply with a predetermined potential to the electrical component 86, the second vias 823 are electrically connected to some of the first vias 812 in a one-to-plurality manner, the second vias 832 are electrically connected to some of the first vias 812 in a one-to-one manner, and the third via 834 is electrically connected to one of the conductive pads 861 in a one-to-one manner so as to apply with a predetermined potential to the electrical component 86.

Due to the difference in the quantity and the distribution density, some of the first vias 812 are electrically connected to the second vias 822 but not electrically connected to the second vias 832, some of the first vias 812 are electrically connected to the second vias 823 but not electrically connected to the second vias 832, some of the first vias 812 are electrically connected to the second vias 832 but not electrically connected to the second vias 822 and 823, some of the first vias 812 are electrically connected to the second vias 822 and the second vias 832, and some of the first vias 812 are electrically connected to the second vias 823 and the second vias 832. Some of the first vias 812 may be at the same potential through one of the second vias 823. Comparing with the second vias 822, each of the second vias 823 may allow a larger current to flow therethrough because it is electrically connected to the first vias 812 in a one-to-plurality manner. The first vias 8120 are electrically floating and neither electrically connected to the second vias 822, 823, and 832 nor any potential.

During operation, a predetermined potential, such as ground or electrical signal, can be applied to some of the first vias 812 by applying it to the second vias 822, 823, and 832.

Further, a predetermined potential is applied to the third vias 824 and 834 so as to be applied to the electrical component 86. Around the first vias 812 that are served as input for electrical signal, the more of the first vias 8120 being electrically floating around the first vias 812 that received electrical signal, the larger the equivalent impedance exists in these first vias 812. To reduce the equivalent impedance in these first vias 812, the first vias 812 therearound are grounded.

Figure 15:
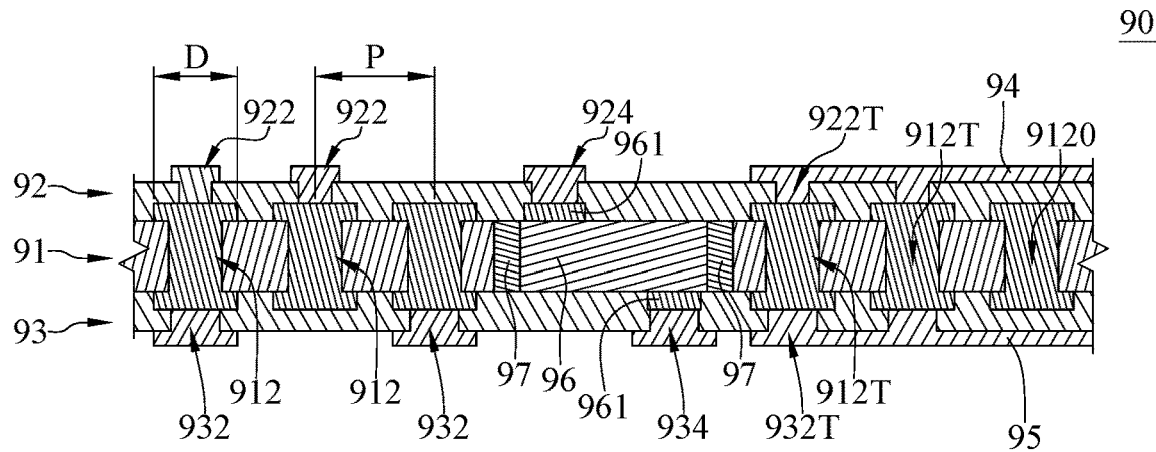
FIG. 15 illustrates a schematic cross-sectional view of an electronic device having the substrate according to another embodiment of the disclosure.

Please refer to FIG. 15, there is illustrated a schematic cross-sectional view of an electronic device having the substrate according to another embodiment of the disclosure.

As shown in FIG. 15, the electronic device 90 includes a substrate 91, an outer layer 92, an outer layer 93, a conductive trace 94, and a conductive trace 95. In this embodiment, the electronic device 90 employs the substrate 91 substantially the same as the substrate 81 shown in FIG. 13. In FIG. 15, the substrate 91 is covered by an outer layer 92 and an outer layer 93, where a plurality of second vias 922 and 922T and a plurality of second vias 932 and 932T are provided in the outer layer 92 and the outer layer 93, and at least one or some of the first vias 912 and 912T that is not electrically connected to the second vias 922, 922T, 932, and 932T will be numbered as '9120'; that is, in FIG. 15, some of the first vias are numbered as '912' and '912T' and the rest is numbered as '9120'. The detail descriptions are given below.

The substrate 91 includes a plurality of first vias 912, 9120, and 912T, an electrical component 96, and a fixing material 97. Each of the first vias 912, 9120, and 912T is solid. The maximum outer diameter D of each of the first vias 912, 9120, and 912T ranges from 5 μm to 100 μm. The first vias 912, 9120, and 912T are arranged in an array. In addition, in FIG. 15, P refers to the center distance between two centers of the first vias 912, 9120, and 912T adjacent to each other. And the smallest center distance P among the first vias 912, 9120, and 912T is in micrometer scale. The electrical component 96 may be an active component or a passive component such as a resistor, a capacitor, an inductor, and the like. Further, the electrical component 96 has conductive pads 961 that can be served as inputs of the electrical component 96 for receiving predetermined potential.

In this embodiment, an insulating layer 921 is disposed on the upper surface of the substrate 91, and the second vias 922 and 922T and the third via 924 are disposed through the insulating layer 921. Each of the second vias 922 is electrically connected to different one of the first vias 912, that is, the second vias 922 are respectively electrically connected to the different first vias 912. In other words, the second vias 922 are electrically connected to some of the first vias 912 in a one-to-one manner. In addition, the third via 924 is electrically connected to one of the conductive pads 961 of the electrical component 96, such that the third via 924 is electrically connected to the electrical component 96. In other words, the third via 924 is electrically connected to one of the conductive pads 961 in a one-to-one manner. Further, each of the second vias 922T is electrically connected to different one of the first vias 912T, that is, the second vias 922T are respectively electrically connected to the different first vias 912T. In other words, the second vias 922T are electrically connected to some of the first vias 912T in a one-to-one manner. The insulating layer 921 and the second vias 922 and 922T and the third via 924 together form the outer layer 92. The conductive trace 94 is disposed on the outer layer 92 and electrically connected to some of the second vias 922T. As shown, in the range of the substrate 91, the first vias 912, 9120, and 912T have a larger distribution density and quantity than the second vias 922 and 922T. Thus, the first vias 9120, some of the first vias 912, and some of the first vias 912T are not electrically connected to the second vias 922 and 922T.

Further, an insulating layer 931 is disposed on the lower surface of the substrate 91, and the second vias 932 and 932T and the third via 934 are disposed through the insulating layer 931. Each of the second vias 932 is electrically connected to different one of the first vias 912, that is, the second vias 932 are respectively electrically connected to the different first vias 912. In other words, the second vias 932 are electrically connected to some of the first vias 912 in a one-to-one manner. In addition, the third via 934 is electrically connected to one of the conductive pads 961 of the electrical component 96, such that the third via 934 is electrically connected to the electrical component 96. In other words, the third via 934 is electrically connected to one of the conductive pads 961 in a one-to-one manner. Further, each of the second vias 932T is electrically connected to different one of the first vias 912T, that is, the second vias 932T are respectively electrically connected to the different first vias 912T. In other words, the second vias 932T are electrically connected to some of the first vias 912T in a one-to-one manner. The insulating layer 931 and the second vias 932 and 932T and the third via 934 together form the outer layer 93. The conductive trace 95 is disposed on the outer layer 93 and electrically connected to some of the second vias 932T. As shown, in the range of the substrate 91, the first vias 912, 9120, and 912T have a larger distribution density and quantity than the second vias 932 and 932T. Thus, the first vias 9120, some of the first vias 912, and some of the first vias 912T are not electrically connected to the second vias 932 and 932T.

As shown, the outer layer 92 and the outer layer 93 are disposed on the upper and lower surface of the substrate 91, respectively. The second vias 922 and 922T are electrically connected to some of the first vias 912 and 912T in a one-to-one manner, the third via 924 is electrically connected to one of the conductive pads 961 in a one-to-one manner so as to apply with a predetermined potential to the electrical component 96, the second vias 932 and 932T are electrically connected to some of the first vias 912 and 912T in a one-to-one manner, and the third via 934 is electrically connected to one of the conductive pads 961 in a one-to-one manner so as to apply with a predetermined potential to the electrical component 96.

Due to the difference in the quantity and the distribution density, some of the first vias 912 are electrically connected to the second vias 922 but not electrically connected to the second vias 932 and 932T, some of the first vias 912 are electrically connected to the second vias 932 but not electrically connected to the second vias 922 and 922T, and some of the first vias 912 are electrically connected to the second vias 922 and the second vias 932, and the first vias 912T are electrically connected to the second vias 922T and the second vias 932T.

The second vias 922T may be at the same potential through the conductive trace 94. The second vias 932T may be at the same potential through the conductive trace 95. The conductive trace 94 and the conductive trace 95 may be electrically connected to each other and at the same potential through the second vias 922T, the first vias 912T, and the second vias 932T which are electrically connected to each other. When a predetermined potential is applied to the conductive trace 94 or the conductive trace 95, the predetermined potential is applied to the second vias 922T, the first vias 912T, and the second vias 932T. The first vias 9120 are electrically floating and neither electrically connected to the second vias 922, 922T, 932, and 932T nor any potential.

During operation, a predetermined potential, such as ground or electrical signal, can be applied to applied to the first vias 912 and 912T by applying it to some of the first vias 922, 922T, 932, and 932T. Further, a predetermined potential is applied to the third vias 924 and 934 so as to be applied to the electrical component 96 Around the first vias 912 and 912T that are served as input for electrical signal, the more of the first vias 9120 being electrically floating around the first vias 912 and 912T that received electrical signal, the larger the equivalent impedance exists in these first vias 912 and 912T. To reduce the equivalent impedance in these first vias 912 and 912T, the first vias 912 and 912T therearound are grounded.

Figure 16:
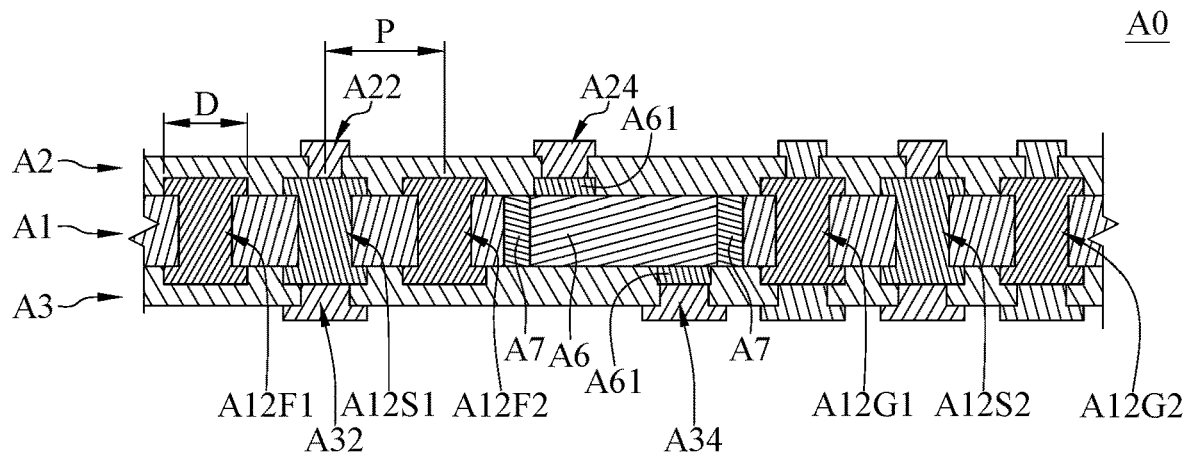
FIG. 16 illustrates a schematic cross-sectional view of an electronic device having the substrate according to another embodiment of the disclosure.

Please refer to FIG. 16, there is illustrated a schematic cross-sectional view of an electronic device having the substrate according to another embodiment of the disclosure.

As shown in FIG. 16, an electronic device A0 includes a substrate A1, an outer layer A2, and an outer layer A3. In this embodiment, the electronic device A0 employs the substrate A1 substantially the same as the substrate 81 in FIG. 13. The detail descriptions are given below.

The substrate A1 includes a plurality of first vias A12F1, A12F2, A12G1, A12G2, A12S1, and A12S2, an electrical component A6, and a fixing material A7. Each of the first vias A12F1, A12F2, A12G1, A12G2, A12S1, and A12S2 is solid. The maximum outer diameter D of each of the first vias A12F1, A12F2, A12G1, A12G2, A12S1, and A12S2 ranges from 5 µm to 100 µm. The first vias A12F1, A12F2, A12G1, A12G2, A12S1, and A12S2 are arranged in an array. In addition, in FIG. 16, P refers to the center distance between two centers of the first vias A12F1, A12F2, A12G1, A12G2, A12S1, and A12S2 adjacent to each other. And the smallest center distance P among the first vias A12F1, A12F2, A12G1, A12G2, A12S1, and A12S2 is in micrometer scale. The electrical component A6 may be an active component or a passive component such as a resistor, a capacitor, an inductor, and the like. Further, the electrical component A6 has conductive pads A61 that can be served as inputs of the electrical component A6 for receiving predetermined potential.

In this embodiment, an insulating layer A21 is disposed on the upper surface of the substrate A1, and a plurality of second vias A22 and a third via A24 are disposed through the insulating layer A21. Each of the second vias A22 is electrically connected to different one of the first vias A12G1, A12G2, A12S1, and A12S2, that is, the second vias A22 are respectively electrically connected to the different first vias A12G1, A12G2, A12S1, and A12S2. In other words, the second vias A22 are electrically connected to the first vias A12G1, A12G2, A12S1, and A12S2 in a one-to-one manner. In addition, the third via A24 is electrically connected to one of the conductive pads A61 of the electrical component A6, such that the third via A24 is electrically connected to the electrical component A6. In other words, the third via A24 is electrically connected to one of the conductive pads A61 in a one-to-one manner. The insulating layer A21, the second vias A22, and the third via A24 together form the outer layer A2. As shown, in the range of the substrate A1, the first vias A12F1, A12F2, A12G1, A12G2, A12S1, and A12S2 have a larger distribution density and quantity than the second vias A22. Thus, the first vias A12F1 and A12F2 are not electrically connected to the second vias A22.

Further, an insulating layer A31 is disposed on the lower surface of the substrate A1, and a plurality of second vias A32 and a third via A34 are disposed through the insulating layer A31. Each of the second vias A32 is electrically connected to different one of the first vias A12G1, A12G2, A12S1, and A12S2, that is, the second vias A32 are respectively electrically connected to the different first vias A12G1, A12G2, A12S1, and A12S2. In other words, the second vias A32 are electrically connected to the first vias A12G1, A12G2, A12S1, and A12S2 in a one-to-one manner. In addition, the third via A34 is electrically connected to one of the conductive pads A61 of the electrical component A6, such that the third via A34 is electrically connected to the electrical component A6. In other words, the third via A34 is electrically connected to one of the conductive pads A61 in a one-to-one manner. The insulating layer A31, the second vias A32, and the third via A34 together form the outer layer A3. As shown, in the range of the substrate A1, the first vias A12F1, A12F2, A12G1, A12G2, A12S1, and A12S2 have a larger distribution density and quantity than the second vias A32. Thus, the first vias A12F1 and A12F2 are not electrically connected to the second vias A32.

As shown, the outer layer A2 and the outer layer A3 are disposed on the upper and lower surface of the substrate A1, respectively. The second vias A22 are electrically connected to the first vias A12G1, A12G2, A12S1, and A12S2 in a one-to-one manner, the third via A24 is electrically connected to one of the conductive pads A61 in a one-to-one manner so as to apply with a predetermined potential to the electrical component A6, the second vias A32 are electrically connected to the first vias A12G1, A12G2, A12S1, and A12S2 in a one-to-one manner, and the third via A34 is electrically connected to one of the conductive pads A61 in a one-to-one manner so as to apply with a predetermined potential to the electrical component A6.

Due to the difference in the quantity and the distribution density, the first vias A12G1, A12G2, A12S1, and A12S2 are electrically connected to the second vias A22 and the second vias A32. The first vias A12F1 and A12F2 are electrically floating and neither electrically connected to the second vias A22 and A32 nor any potential.

The first vias A12F1, A12F2, A12G1, A12G2, A12S1, and A12S2 includes the first vias A12G1 and A12G2 that can be used as ground vias and the first vias A12S1 and A12S2 that can be used as signal vias.

In addition, the first via A12F1 being electrically floating is arranged adjacent to the first via A12S1 being used as a signal via. The first vias A12F1 and A12F2 being electrically floating are arranged around the first via A12S1 being used as a signal via. The first vias A12F1 and A12F2 being electrically floating and the first via A12S1 being used as a signal via are arranged in an alternate manner.

Further, the first via A12G1 being used as a ground via is arranged adjacent to the first via A12S2 being used as a signal via. The first vias A12G1 and A12G2 being used as ground vias are arranged around the first via A12S2 being used as a signal via. The first vias A12G1 and A12G2 being used as ground vias and the first via A12S2 being used as a signal via are arranged in an alternate manner.

During operation, a predetermined potential can be the first vias A12G1, A12G2, A12S1, and A12S2 by applying it to some of the first vias A22 and A32, such as grounding the first vias A12G1 and A12G2 and inputting electrical signal to the first vias A12S1 and A12S2 will serve as an input of electrical signal. Further, a predetermined potential is applied to the third vias A24 and A34 so as to be applied to the electrical component A6.

In this embodiment, the first vias A12F1 and A12F2 being electrically floating are arranged around the first via A12S1. The first vias A12G1 and A12G2 being used as ground vias are arranged to the first via A12S3. Comparing among the equivalent impedances existing in the first vias A12S1 and A12S2, the equivalent impedance existing in the first via A12S1 is larger than that existing in the first via A12S2.

Figure 17:
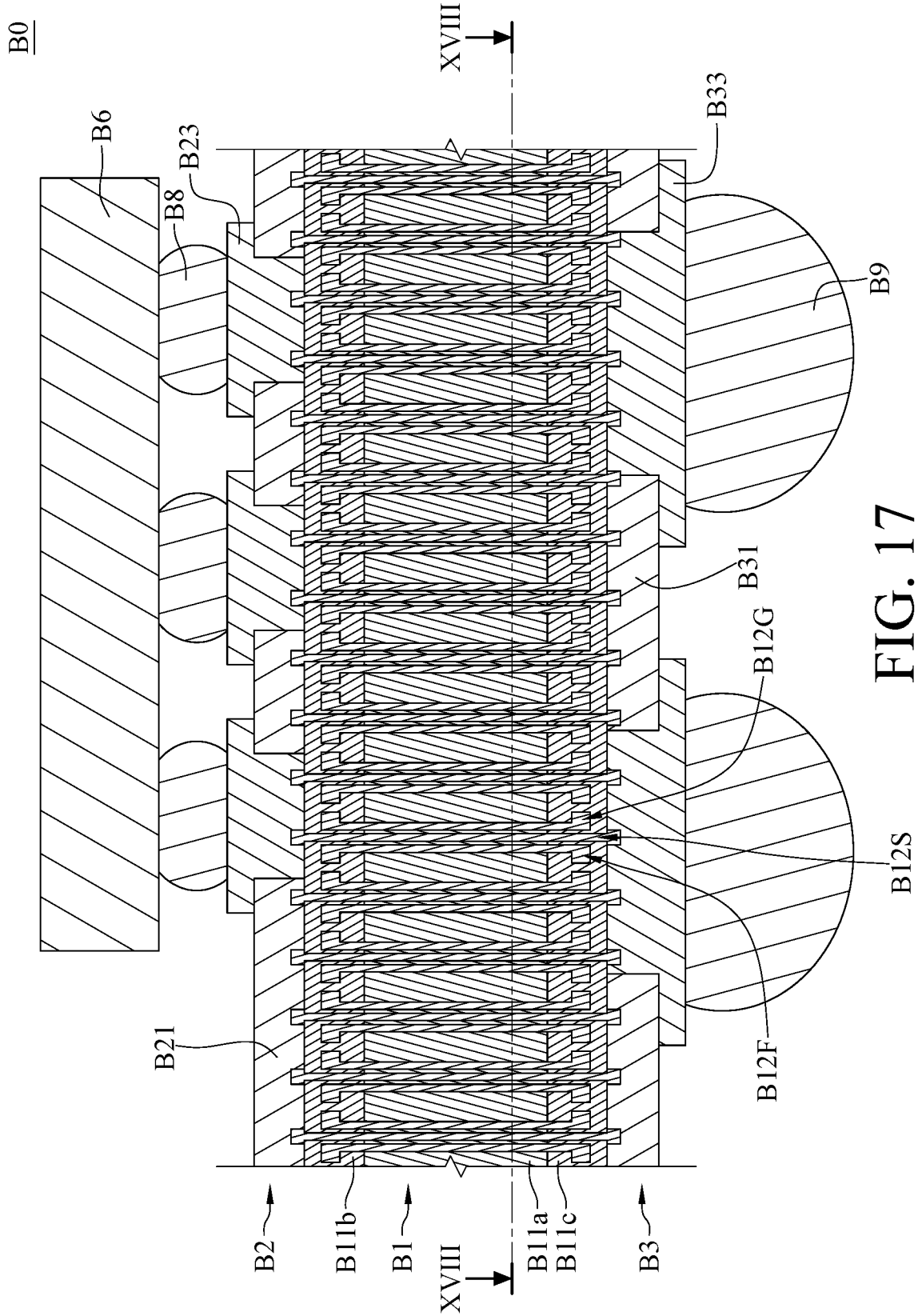
FIG. 17 illustrates a schematic cross-sectional view of an electronic device having the substrate according to another embodiment of the disclosure.
Figure 18:
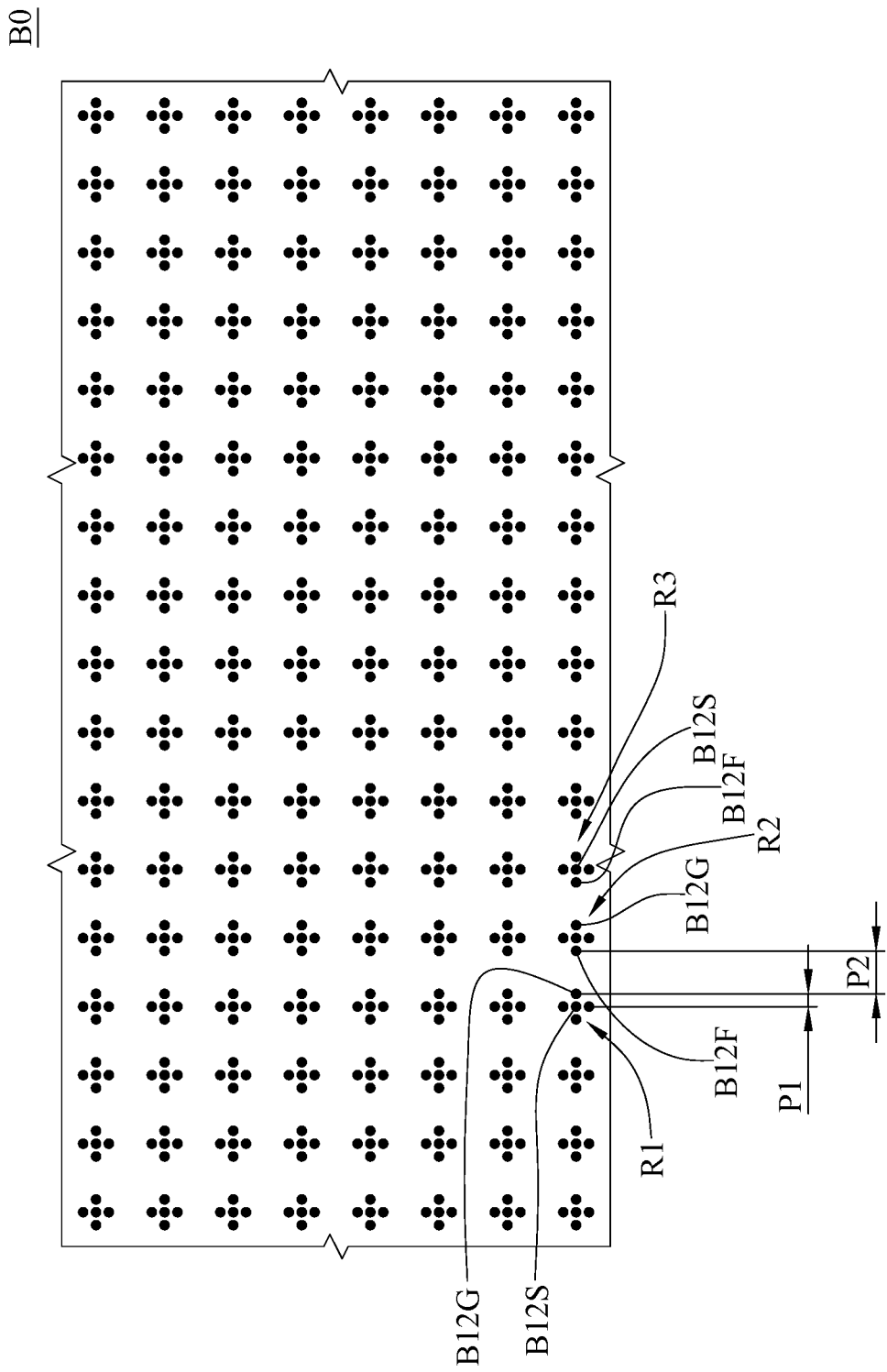
FIG. 18 illustrates a schematic cross-sectional top view of the electronic device having the substrate taken along a line XVIII-XVIII in FIG. 17.
Figure 19:
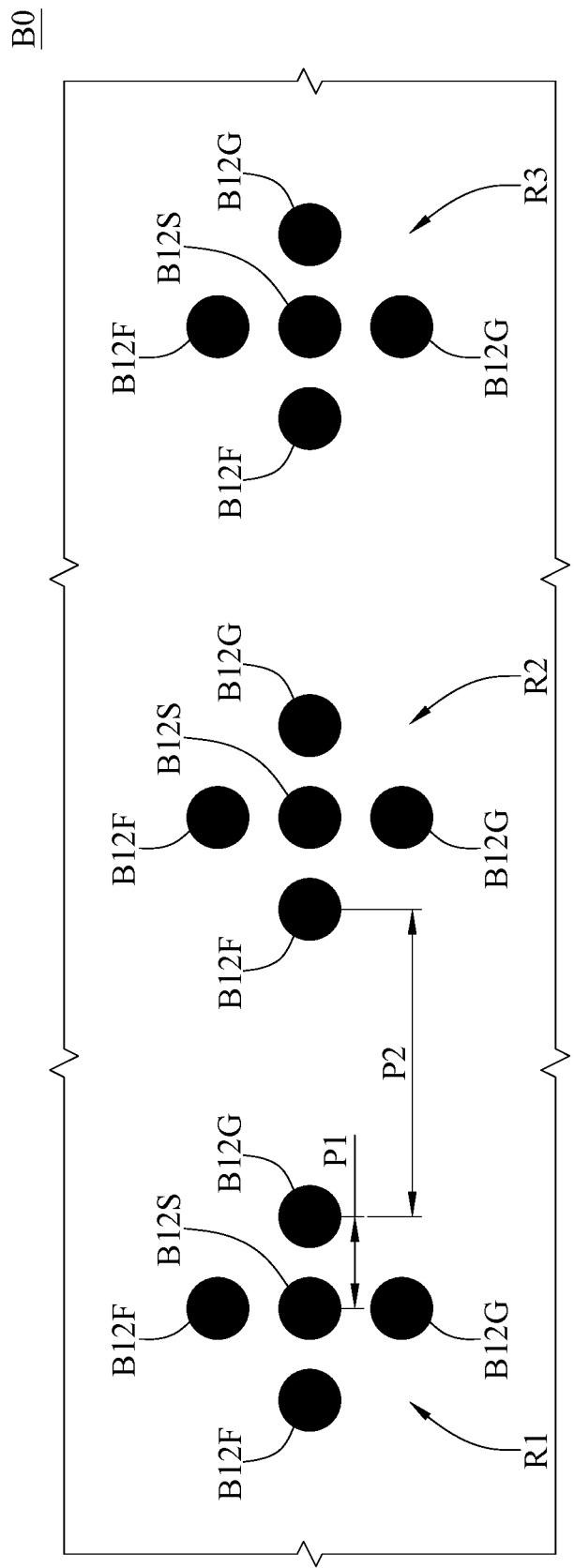
FIG. 19 illustrates an enlarged schematic cross-sectional top view of the electronic device having the substrate in FIG. 18.

Please refer to FIG. 17, FIG. 18, and FIG. 19, where FIG. 17 illustrates a schematic cross-sectional view of an electronic device having the substrate according to another embodiment of the disclosure, FIG. 18 illustrates a schematic cross-sectional top view of the electronic device having the substrate taken along a line XVIII-XVIII in FIG. 17, and FIG. 19 illustrates an enlarged schematic cross-sectional top view of the electronic device having the substrate in FIG. 18.

As shown in FIG. 17, in this embodiment, the electronic device B0 includes a substrate B1, an outer layer B2, an outer layer B3, an electrical component B6, a plurality of conductive materials B8, and a plurality of conductive materials B9. The detail descriptions are given below.

In this embodiment, the substrate B1 includes a first core layer B11a, a second core layer B11b, a third core layer B11c, and a plurality of first vias B12F, B12G, and B12S. The first vias B12F and B12G are disposed through the first core layer B11a and spaced apart from one another. The second core layer B11b and the third core layer B11c are disposed on an upper surface and a lower surface of the first core layer B11a, respectively, and cover the first vias B12F and B12G. The first vias B12S are disposed through the second core layer B11b, the first core layer B11a, and the third core layer B11c. Each of the first vias B12F, B12G, and B12S is solid. The maximum outer diameter DF of each of the first vias B12F ranges from 5 µm to 100 µm. The maximum outer diameter DG of each of the first vias B12G ranges from 5 µm to 100 µm. The maximum outer diameter DS of each of the first vias B12S ranges from 5 µm to 100 µm. The first core layer B11a, the second core layer B11b, and the third core layer B11c are made of a material selected from a group consisting of a semiconductor material (e.g., silicon, gallium, germanium, and gallium nitride) and a non-conductive material (e.g., epoxy resin).

As shown in FIG. 18 and FIG. 19, the first vias B12F, B12G, and B12S are arranged into a plurality of groups R1, R2, and R3. The groups R1, R2, and R3 are arranged in an array.

As shown in FIG. 18 and FIG. 19, a first center distance P1 refers to the center distance between two centers of the first vias B12F, B12G, and B12S located adjacent to each other and both located in one of the groups R1, R2, and R3, and the smallest first center distance P1 among the first vias B12F, B12G, and B12S is in micrometer scale. A second center distance P2 refers to the center distance between two centers of any two of the first vias B12F, B12G, and B12S located adjacent to each other and respectively located in any two of the groups R1, R2, and R3. The smallest first center distance P1 is smaller than the smallest second center distance P2.

Specifically, in the adjacent groups R1 and R2, the two centers of the first vias B12G and B12S adjacent to each other in the group R1 are spaced apart by the smallest first center distance P1, the center of the first via B12G in the group R1 and the center of the first via B12F in the group R2 are spaced apart by the smallest second center distance P2, and the smallest first center distance P1 is smaller than the smallest second center distance P2. In addition, in the adjacent groups R2 and R3, the two centers of the first vias B12F and B12S adjacent to each other in the group R3 are spaced apart by the smallest first center distance P1, the center of the first via B12G in the group R2 and the center of the first via B12F in the group R3 are spaced apart by the smallest second center distance P2, and the smallest first center distance P1 is smaller than the smallest second center distance P2.

Further, in one of the groups R1, R2, and R3, the first via B12S being used as a signal via, the first vias B12G being used as ground vias, and the first vias B12F are electrically floating. For example, in the group R1, there are one first via B12S, two first vias B12F, and two first vias B12G. In this embodiment, the two first vias B12F and the two first vias B12G are arranged around the first via B12S, and the disclosure is not limited thereto. In other embodiments, there are other amount of the first vias B12F and other amount of the first vias B12G surrounding one of the first via B12S. In other embodiments, there are other amount of the first vias B12F, other amount of the first vias B12G, and other amount of the first vias B12S arranged in one of the groups R1, R2, and R3.

As shown in FIG. 17, in this embodiment, an insulating layer B21 is disposed on the upper surface of the substrate B1, and a plurality of second vias B23 is disposed through the insulating layer B21. Each of the second vias B23 is electrically connected to different some of the first vias B12S. In other words, the second vias B23 are electrically connected to the first via B12S in a one-to-plurality manner. The insulating layer B21 and the second vias B23 together form the outer layer B2. As shown, in the range of the substrate B1, the first vias B12F, B12G, and B12S have a larger distribution density and quantity than the second vias B23. Thus, the first vias B12F and B12G and some of the first vias B12S are not electrically connected to the second vias B23.

Further, an insulating layer B31 is disposed on the upper surface of the substrate B1, and a plurality of second vias B33 is disposed through the insulating layer B31. Each of the second vias B33 is electrically connected to different some of the first vias B12S. In other words, the second vias B33 are electrically connected to the first via B12S in a one-to-plurality manner. The insulating layer B31 and the second vias B33 together form the outer layer B3. As shown, in the range of the substrate B1, the first vias B12F, B12G, and B12S have a larger distribution density and quantity than the second vias B33. Thus, the first vias B12F and B12G and some of the first vias B12S are not electrically connected to the second vias B33.

As shown, the outer layer B2 and the outer layer B3 are disposed on the upper and lower surface of the substrate B1, respectively. The second vias B23 are electrically connected to some of the first vias B12S in a one-to-plurality manner, and the second vias B33 are electrically connected to some of the first vias B12S in a one-to-plurality manner.

Due to the difference in the quantity and the distribution density, some of the first vias B12S are electrically connected to the second vias B23 but not electrically connected to the second vias B33, some of the first vias B12S are electrically connected to the second vias B33 but not electrically connected to the second vias B23, and some of the first vias B12S are electrically connected to the second vias B23 and the second vias B33. Some of the first vias B12S may be at the same potential through one of the second vias B23. Each of the second vias B23 may allow a large current to flow therethrough because it is electrically connected to the first vias B12S in a one-to-plurality manner. Some of the first vias B12S may be at the same potential through one of the second vias B33. Each of the second vias B33 may allow a large current to flow therethrough because it is electrically connected to the first vias B12S in a one-to-plurality manner.

The first vias B12G may be grounded. The first vias B12F are electrically floating and neither electrically connected to the second vias B23 and B33 nor any potential.

In this embodiment, the conductive materials B8 are electrically connected to the second vias B23, respectively. The electrical component B6 is disposed on the outer layer B2 and electrically connected to the second vias B23 through the conductive materials B8. The electrical components B6 may be an active component or a passive component such as a resistor, a capacitor, an inductor, and the like. The conductive materials B9 are electrically connected to the second vias B33, respectively. The conductive materials B8 and B9 may be solder balls.

During operation, a predetermined potential, such as ground or electrical signal, can be applied to the conductive materials B8 by applying it to the conductive materials B9, the second vias B33, some of the first vias B12S, and the second vias B23. Therefore, the predetermined potential is further applied to the electrical component B6 Around the first vias B12S that are served as input for electrical signal, the more of the first vias B12F being electrically floating around the first vias B12S that received electrical signal, the larger the equivalent impedance exists in these first vias B12S. To reduce the equivalent impedance in these first vias B12S, the first vias B12G therearound are grounded.

Figure 20:
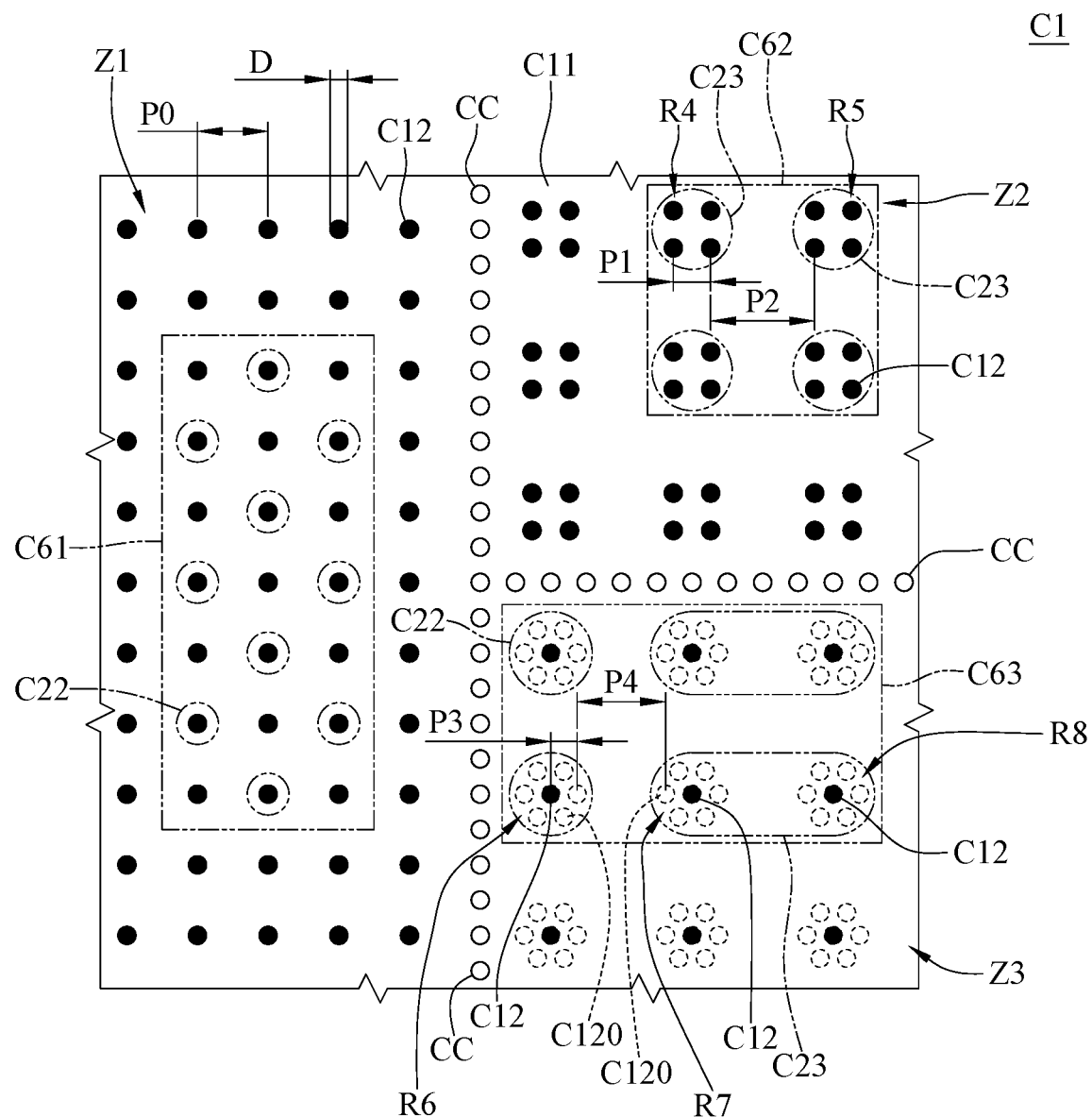
FIG. 20 illustrates a schematic top view of a substrate according to another embodiment of the disclosure.

Please refer to FIG. 20, there is illustrated a schematic top view of a substrate according to another embodiment of the disclosure.

As shown in FIG. 20, in this embodiment, the substrate C1 includes a core layer C11 and a plurality of the first vias C12 and C120. The first vias C12 are disposed through the core layer C11 and spaced apart from one another. Also, the first vias C12 are distributed in regions Z1, Z2, and Z3. The first vias C120 are buried in the core layer C11 and located in the region Z3. The first vias C12 and C120 have different arrangements among the regions Z1, Z2, and Z3. Each of the first vias C12 and C120 is solid. The maximum outer diameter D of each of the first vias C12 and C120 ranges from 5 μm to 100 μm. The detail descriptions are given below.

In addition, there are a plurality of marks CC on the core layer C11. The marks CC are arranged in two lines that can divide the core layer C11 into the regions Z1, Z2, and Z3. Each of the marks CC may be a through hole disposed through the core layer C11. Each of the marks CC may be a blind hole formed on the core layer C11. Alternatively, each of the marks CC may be aground via disposed through the core layer C11. The marks CC enable the positioning of electrical components on the core layer C11 by an optical detection apparatus. Specifically, when a plurality of electrical components C61, C62, and C63 are mounted in the regions Z1, Z2, and Z3, the positions of the electrical components C61, C62, and C63 with respect to the regions Z1, Z2, and Z3 can be confirmed by using a suitable optical detection apparatus to scan the marks CC. In the case that the marks CC are the ground vias disposed through the core layer C11, the regions Z1, Z2, and Z3 will be electrically shielded to avoid electrical signals applied to the first vias C12 in the different regions Z1, Z2, and Z3 from interfering with each other. Also, the core layer C11 is made of a material selected from a group consisting of a semiconductor material (e.g., silicon, gallium, germanium, and gallium nitride) and a non-conductive material (e.g., epoxy resin).

In addition, in the region Z1, the first vias C12 are arranged in a rectangular array. P0 refers to the center distance between two centers of the first vias C12 adjacent to each other, and the smallest center distance P0 among the first vias C12 is in micrometer scale. Each of the second vias C22 is electrically connected to different one of the first vias C12, that is, the second vias C22 are respectively electrically connected to the different first vias C12. In other words, the second vias C22 are electrically connected to some of the first vias C12 in a one-to-one manner. The electrical component C61 may be disposed in the region Z1 and electrically connected to the second vias C22. The electrical component C61 may further be electrically connected to the first vias C12 through the second vias C22. The first vias C12 which are not electrically connected to any of the second vias C22 may be grounded or electrically connected to a predetermined potential as required. The first vias C12 which are neither electrically connected to any of the second vias C22 nor any potential are electrically floating. The electrical component C61 may be, for example, a chip that can transmit or process digital signals. In another embodiment, the electrical component C61 may be another active component or a passive component, such as a resistor, a capacitor, an inductor, and the like.

Further, in the region Z2, the first vias C12 are arranged into a plurality of groups R4 and R5, and the groups R4 and R5 are arranged in an array. A first center distance P1 refers to the center distance between two centers of the first vias C12 adjacent to each other in one of the groups R4 and R5. A second center distance P2 refers to the center distance between two centers of any two of the first vias C12 respectively located in any two of the groups R4 and R5 adjacent to each other. The smallest first center distance P1 is smaller than the smallest second center distance P2. Each of the second vias C23 is electrically connected to the first vias C12 in one of the groups R4 and R5. In other words, the second vias C23 are electrically connected to the first via C12 in a one-to-plurality manner. The electrical component C62 may be disposed in the region Z2 and electrically connected to the second vias C23. The electrical component C62 may further be electrically connected to the first vias C12 through the second vias C23. The first vias C12 which are not electrically connected to any of the second vias C23 may be grounded or electrically connected to a predetermined potential as required. The first vias C12 which are neither electrically connected to any of the second vias C23 nor any potential are electrically floating.

Comparing with the second vias C22, each of the second vias C23 may allow a larger current to flow therethrough because it is electrically connected to the first vias C12 in a one-to-plurality manner. Since each of the second via C23 electrically connected to the electrical component C62 may allow a larger current, the electrical component C62 may be, for example, a power management integrated circuit (PMIC) that requires a large current tolerance. In another embodiment, the electrical component C62 may be another active component or a passive component, such as a resistor, a capacitor, an inductor, and the like.

Additionally, in the region Z3, the first vias C12 and C120 are arranged into a plurality of groups R6, R7, and R8, and the groups R6, R7, and R8 are arranged in an array. In one of the groups R6, R7, and R8, there are one of the first vias C12 disposed through the core layer C11 and a plurality of the first vias C120 buried in but not through the core layer C11. The first vias C120 are arranged around the first via C12. A third center distance P3 refers to the center distance between two centers of the first vias C12 and C120 adjacent to each other in one of the groups R6, R7, and R8. A fourth center distance P4 refers to the center distance between two centers of any two of the first vias C12 and C120 respectively located in any two of the groups R6 and R7 adjacent to each other. The smallest third center distance P3 is smaller than the smallest fourth center distance P4.

Each of the second vias C22 is electrically connected to different one of the first vias C12, that is, the second vias C22 are respectively electrically connected to the different first vias C12. In other words, the second vias C22 are electrically connected to some of the first vias C12 in a one-to-one manner. Each of the second vias C23 is electrically connected to the first vias C12 in the different groups R7 and R8. In other words, the second vias C23 are electrically connected to the first via C12 in a one-to-plurality manner. Comparing with the second vias C22, each of the second vias C23 may allow a larger current to flow therethrough because it is electrically connected to the first vias C12 in a one-to-plurality manner. The electrical component C63 may be disposed in the region Z3 and electrically connected to the second vias C22 and C23. The electrical component C63 may further be electrically connected to the first vias C12 through the second vias C22 and C23. The first vias C12 and C120 which are not electrically connected to any of the second vias C22 and C23 may be grounded or electrically connected to a predetermined potential as required. The first vias C12 and C120 which are neither electrically connected to any of the second vias C22 and C23 nor any potential are electrically floating.

Around the first vias C12 that are served as input for electrical signal, the more of the first vias C12 and C120 being electrically floating around the first vias C12 that received electrical signal, the larger the equivalent impedance exists in these first vias C12. To reduce the equivalent impedance in these first vias C12, the first vias C12 and C120 therearound are grounded. In this condition, the electrical component C63 may transmit or process high-frequency signals with low distortion and low loss. The electrical component C63 may be, for example, a chip that can transmit or process analog signals. In another embodiment, the electrical component C63 may be another active component or a passive component, such as a resistor, a capacitor, an inductor, and the like.

According to the electronic device having the substrate as discussed in the above embodiments of the disclosure, the first vias have a larger distribution density or quantity than the second vias, such that the second vias can enable the installation of most types of external electrical components to the substrate while causing a part of the first vias to be electrically floating. That is, the above arrangement of the first and second vias make the substrate suitable for most types of external electrical components. Thus, the time and cost of developing and manufacturing substrates customized for different configurations of external electrical components are saved.

In addition, around the first vias that are served as input for electrical signal, the more of the first vias being electrically floating around the first vias that received electrical signal, the larger the equivalent impedance exists in these first vias. To reduce the equivalent impedance in these first vias, the first vias therearound are grounded. Therefore, the equivalent impedances among the conductive elements through which the electrical signal passes may match each other. Accordingly, excessive attenuation or distortion of electrical signals due to impedance mismatch may be avoided, thereby maintaining the strength of the electrical signals in the substrate and improving the accuracy of the electrical signals.

Although the disclosure is disclosed in the foregoing embodiments, it is not intended to limit the disclosure. All variations and modifications made without departing from the spirit and scope of the disclosure fall within the scope of the disclosure. For the scope defined by the disclosure, please refer to the attached claims.

What is claimed is:

1. An electronic device, comprising:
   a substrate, having a plurality of first vias; and
   at least one outer layer, having a plurality of second vias,
   wherein the at least one outer layer is disposed on a side of the substrate,
   wherein the plurality of first vias has a larger distribution density or quantity than the plurality of second vias, so that a part of the first vias are electrically connected to the plurality of second vias, and another part of the first vias are electrically floating.

2. The electronic device according to claim 1, wherein each of the plurality of first vias is solid.

3. The electronic device according to claim 1, wherein the plurality of first vias are arranged in an array.

4. The electronic device according to claim 1, wherein the plurality of second vias are electrically connected to the plurality of first vias in a one-to-one manner.

5. The electronic device according to claim 1, wherein the plurality of second vias are electrically connected to the plurality of first vias in a one-to-plurality manner.

6. The electronic device according to claim 1, further comprising a conductive trace, disposed on the at least one outer layer and electrically connected to at least two of the plurality of second vias.

7. The electronic device according to claim 1, wherein the plurality of first vias comprise a ground via and a signal via, and the ground via is arranged adjacent to the signal via.

8. The electronic device according to claim 1, wherein the plurality of first vias comprise a plurality of ground vias and a signal via, and the plurality of ground vias are arranged around the signal via.

9. The electronic device according to claim 1, wherein the plurality of first vias comprise a plurality of ground vias and a plurality of signal vias, and the plurality of ground vias and the plurality of signal vias are arranged in an alternate manner.

10. The electronic device according to claim 1, further comprising an electrical component embedded or buried in the substrate.

11. The electronic device according to claim 10, wherein at least one of the plurality of first vias penetrates through the electrical component.

12. The electronic device according to claim 10, wherein the at least one outer layer has a third via, and the third via is electrically connected to the electrical component.

13. The electronic device according to claim 10, wherein the electrical component is an active component or a passive component.

14. The electronic device according to claim 1, further comprising an electrical component disposed on the at least one outer layer and electrically connected to at least one of the plurality of second vias.

15. The electronic device according to claim 14, wherein the electrical component is an active component or a passive component.

16. The electronic device according to claim 1, wherein the plurality of first vias are arranged in a plurality of groups, two of the first vias adjacent to each other in one of the plurality of groups are spaced apart by a first center distance, any two of the first vias respectively located in any two of the plurality of groups adjacent to each other are spaced apart by a second center distance, and the first center distance is smaller than the second center distance.

17. The electronic device according to claim 16, wherein in one of the plurality of groups, at least one of the first vias is a signal via, and at least one of the first vias is a ground via.

18. The electronic device according to claim 16, wherein in one of the groups, at least one of the first vias is a signal via, and at least one of the first vias is electrically floating.

19. The electronic device according to claim 16, wherein in one of the groups, at least one of the first vias is a ground via, and at least one of the first vias is electrically floating.

20. The electronic device according to claim 16, wherein in one of the groups, at least one of the first vias is a signal via, at least one of the first vias is a ground via, and at least one of the first vias is electrically floating.

21. The electronic device according to claim 1, wherein each of the plurality of first vias has an outer diameter ranging from 5 μm to 100 μm.

22. The electronic device according to claim 1, wherein a center distance between every two of the plurality of first vias adjacent to each other is in micrometer scale.

23. The electronic device according to claim 1, wherein the substrate comprises a core layer made of a material selected from a group consisting of a semiconductor material and a non-conductive material.

24. The electronic device according to claim 1, wherein the substrate comprises a core layer made of a material selected from a group consisting of silicon, gallium, germanium, gallium nitride, and epoxy resin.

* * * * *